(12) United States Patent
Yamazaki et al.

(10) Patent No.: US 9,052,587 B2
(45) Date of Patent: Jun. 9, 2015

(54) CONDUCTIVE PATTERN FORMATION METHOD, CONDUCTIVE PATTERN-BEARING SUBSTRATE, AND TOUCH PANEL SENSOR

(71) Applicant: Hitachi Chemical Company, Ltd., Tokyo (JP)

(72) Inventors: Hiroshi Yamazaki, Hitachi (JP); Yoshimi Igarashi, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/881,854

(22) PCT Filed: Oct. 1, 2012

(86) PCT No.: PCT/JP2012/075421
§ 371 (c)(1),
(2) Date: Apr. 26, 2013

(87) PCT Pub. No.: WO2013/051516
PCT Pub. Date: Apr. 11, 2013

(65) Prior Publication Data
US 2014/0327889 A1    Nov. 6, 2014

(30) Foreign Application Priority Data
Oct. 3, 2011 (JP) ................ P2011-219176

(51) Int. Cl.
*H05K 3/06* (2006.01)
*G03F 7/00* (2006.01)
(Continued)

(52) U.S. Cl.
CPC .............. *G03F 7/0005* (2013.01); *H05K 3/06* (2013.01); *G03F 7/027* (2013.01); *G03F 7/092* (2013.01); *G03F 7/095* (2013.01); *G03F 7/0952* (2013.01); *G03F 7/0955* (2013.01); *G03F 7/2022* (2013.01)

(58) Field of Classification Search
CPC ........................................................ H05K 3/06
USPC ............................................................ 29/829
See application file for complete search history.

(56) References Cited

U.S. PATENT DOCUMENTS 5,626,948 A * 5/1997 Ferber et al. ............... 428/195.1
7,259,106 B2 * 8/2007 Jain ............................. 438/737
(Continued)

FOREIGN PATENT DOCUMENTS

EP    2 320 433    5/2011
JP    08-240815    9/1996
(Continued)

OTHER PUBLICATIONS

Japanese Official Action dated Mar. 26, 2013, for JP Application No. 2013-503897.
(Continued)

*Primary Examiner* — Evan Pert
(74) *Attorney, Agent, or Firm* — Fitch, Even, Tabin & Flannery LLP

(57) ABSTRACT

A conductive pattern formation method of the present invention includes a first exposure step of radiating active light in a patterned manner to a photosensitive layer including a photosensitive resin layer provided on a substrate and a conductive film provided on a surface of the photosensitive resin layer on a side opposite to the substrate; a second exposure step of radiating active light, in the presence of oxygen, to some or all of the portions of the photosensitive layer not exposed at least in the first exposure step; and a development step of developing the photosensitive layer to form a conductive pattern following the second exposure step.

24 Claims, 10 Drawing Sheets

(51) Int. Cl.
*G03F 7/027* (2006.01)
*G03F 7/09* (2006.01)
*G03F 7/095* (2006.01)
*G03F 7/20* (2006.01)

(56) References Cited

U.S. PATENT DOCUMENTS

| | | | | |
|---|---|---|---|---|
| 8,018,568 B2* | 9/2011 | Allemand et al. | | 349/187 |
| 8,094,247 B2* | 1/2012 | Allemand et al. | | 349/12 |
| 8,174,667 B2* | 5/2012 | Allemand et al. | | 349/187 |
| 8,198,796 B2* | 6/2012 | Takada | | 313/352 |
| 8,199,118 B2* | 6/2012 | Pennington et al. | | 345/173 |
| 8,426,741 B2* | 4/2013 | Yamazaki | | 174/255 |
| 8,460,747 B2* | 6/2013 | Veerasamy | | 427/122 |
| 8,648,525 B2* | 2/2014 | Chiba et al. | | 313/503 |
| 8,674,233 B2* | 3/2014 | Yamazaki | | 174/257 |
| 8,760,606 B2* | 6/2014 | Allemand et al. | | 349/111 |
| 2001/0008717 A1* | 7/2001 | Iijima | | 428/702 |
| 2002/0012789 A1* | 1/2002 | Iijima | | 428/328 |
| 2002/0110673 A1* | 8/2002 | Heydarpour et al. | | 428/209 |
| 2003/0092267 A1* | 5/2003 | Kian et al. | | 438/690 |
| 2006/0062898 A1* | 3/2006 | Rankin et al. | | 427/58 |
| 2007/0074316 A1 | 3/2007 | Alden et al. | | |
| 2009/0117327 A1* | 5/2009 | Takada | | 428/141 |
| 2011/0147054 A1* | 6/2011 | Yamazaki | | 174/254 |
| 2011/0297642 A1* | 12/2011 | Allemand et al. | | 216/13 |
| 2012/0015098 A1* | 1/2012 | Cheng et al. | | 427/110 |
| 2012/0138348 A1* | 6/2012 | Yamazaki | | 174/257 |
| 2012/0285726 A1* | 11/2012 | Tokunaga et al. | | 174/126.2 |
| 2013/0048339 A1* | 2/2013 | Tour et al. | | 174/126.1 |
| 2013/0342221 A1* | 12/2013 | Virkar et al. | | 324/661 |
| 2014/0008115 A1* | 1/2014 | Sato et al. | | 174/258 |
| 2014/0076490 A1* | 3/2014 | Takada | | 156/249 |
| 2014/0120027 A1* | 5/2014 | Tanabe et al. | | 423/447.2 |
| 2014/0124253 A1* | 5/2014 | Yamazaki | | 174/257 |
| 2014/0131078 A1* | 5/2014 | Joo et al. | | 174/257 |
| 2014/0202531 A1* | 7/2014 | Oya et al. | | 136/256 |
| 2014/0202742 A1* | 7/2014 | Jones et al. | | 174/253 |
| 2014/0203223 A1* | 7/2014 | Ikada et al. | | 252/514 |
| 2014/0225260 A1* | 8/2014 | Yang et al. | | 257/746 |
| 2014/0234661 A1* | 8/2014 | Allemand et al. | | 428/673 |

FOREIGN PATENT DOCUMENTS

| | | |
|---|---|---|
| JP | 2004-163533 | 10/2004 |
| JP | 2005-093444 | 4/2005 |
| JP | 2008-233993 | 10/2008 |
| JP | 2010-181563 | 8/2010 |
| JP | 2011-017975 | 1/2011 |
| TW | 201124479 | 7/2011 |
| TW | 201129576 | 9/2011 |
| TW | 201131307 | 9/2011 |
| WO | WO 2010/021224 | 2/2010 |

OTHER PUBLICATIONS

International Search Report mailed Dec. 18, 2012, for International (PCT) Application No. PCT/JP2012/075421.
Notification of Transmittal of Translation of the International Preliminary Report on Patentability (Chapter I or Chapter II), including the Written Opinion of the International Searching Authority, dated Apr. 17, 2014, for International (PCT) Application No. PCT/JP2012/075421.
Taiwanese Official Action dated Aug. 29, 2013, for TW Application No. 101136523.
Extended European Search Report dated Dec. 13, 2013, including a Supplementary European Search Report and an European Search Opinion, for EP Application No. 12838597.8-1564/2620814 (PCT/JP2012/075421).

* cited by examiner (a)

(b)

(c)

(d)

(a)

(b)

(c)

(d)

(a)

(b)

(c)

US 9,052,587 B2

CONDUCTIVE PATTERN FORMATION METHOD, CONDUCTIVE PATTERN-BEARING SUBSTRATE, AND TOUCH PANEL SENSOR

TECHNICAL FIELD

The present invention relates to a conductive pattern formation method, a conductive pattern-bearing substrate, and a touch panel sensor. More particularly, the present invention relates to a method for forming a conductive pattern used as electrode wiring lines in flat-panel displays, such as a liquid crystal display device, touch panels (touchscreens), solar cells, lighting devices, and the like, a conductive pattern-bearing substrate, and a touch panel sensor.

BACKGROUND ART

Liquid crystal display devices and touch panels have become widely used in large-size electronic equipment, such as personal computers and TV sets, small-size electronic equipment, such as car navigation devices, mobile phones and electronic dictionaries, and display equipment, such as office and factory automation equipment. In these liquid crystal display devices and touch panels and in such devices as solar cells and lighting devices as well, a transparent conductive film is used in wiring lines, pixel electrodes or some terminals required to be transparent.

Conventionally, an ITO (Indium-Tin-Oxide), an indium oxide, a tin oxide, or the like has been used as the material of a transparent conductive film since the oxide exhibits high transmissivity with respect to visible light. Thus, patterned transparent conductive films made from the above-described materials prevail among electrodes provided in a substrate or the like for liquid crystal display devices.

As a method for patterning a transparent conductive film, there is generally used a method in which, after a transparent conductive film is formed on a base material, a resist pattern is formed by a photolithographic method and predetermined portions of the conductive film are removed by wet etching, thereby forming a conductive pattern. In the case of an ITO film and an indium oxide film, a mixed liquid composed of two liquids, i.e., hydrochloric acid and ferric chloride, is often used as an etching liquid.

An ITO film and a tin oxide film are generally formed by a sputtering method. In this method, the nature of the transparent conductive film is changeable, depending on a difference in sputtering system, sputtering power, gas pressure, substrate temperature, the type of ambient gas, and the like. A difference in the quality of the transparent conductive film due to a variation in sputtering conditions can be a cause for the variation of an etching rate at the time of wet-etching the transparent conductive film. Thus, the difference is liable to cause degradation in product yields due to patterning failure. In addition, the above-described method for forming conductive patterns takes a long process time and is burdensome costwise since the method goes through a sputtering step, a resist formation step and an etching step.

In recent years, attempts have been made to form conductive patterns using materials alternative to an ITO, an indium oxide, a tin oxide and the like, in order to cut down the above-described problems. For example, Patent Literature 1 cited below discloses a conductive pattern formation method in which after a conductive layer containing conductive fiber, such as silver fiber, is formed on a substrate, a photosensitive resin layer is formed on the conductive layer, and then the photosensitive resin layer is exposed and developed from thereabove through a pattern mask. Patent Literature 2 cited below discloses a conductive pattern formation method using a photosensitive conductive film.

CITATION LIST

Patent Literatures

Patent Literature 1: U.S. Patent Publication No. 2007/0074316
Patent Literature 2: International Patent Publication No. WO 2010/021224

SUMMARY OF INVENTION

Technical Problem

It has been made clear by the study of the present inventors et al., however, that the method described in Patent Literature 1 has difficulty in reducing the surface resistance of the conductive pattern while ensuring adhesiveness between the substrate and the conductive pattern. In addition, a step of removing the photosensitive resin layer is required in order to use the abovementioned conductive pattern as wiring lines, pixel electrodes or terminals. Thus, the method has the problem that the step of forming the conductive pattern is complicated.

In the method described in Patent Literature 2, a photosensitive resin layer 3 of a photosensitive conductive film 10 including a support film 1, a conductive film 2 and a photosensitive resin layer 3 is laminated on a substrate 20 (FIG. 10(a)), for example, as illustrated in FIG. 10. Next, active light L is radiated in a patterned manner to the photosensitive resin layer 3 through a mask 5 (FIG. 10(b)). The photosensitive resin layer 3 is developed to remove the uncured portions (unexposed portions) thereof, thereby forming a conductive pattern (conductive film 2a) (FIG. 10(c)). The conductive pattern thus obtained has a thickness given by adding the thickness of a resin cured layer 3b to the thickness of the conductive film 2a. These thicknesses result in a step difference Hb of the conductive pattern from the substrate. This step difference, if too large, makes it difficult to attain smoothness required of displays and the like. In addition, a large step difference makes the conductive pattern easily visible.

If two layers of conductive patterns are provided in combination as in the case of, for example, an electrostatic capacitance-type touch panel, a photosensitive conductive film may be newly laminated on the formed conductive patterns. If a step difference is large at this time, air bubbles may be caught up therein, thus making the conductive patterns even more easily visible.

The present invention has been accomplished in view of the above-described circumstances, and an object of the invention is to provide a conductive pattern formation method capable of forming a conductive pattern small in step difference on a substrate, and a conductive pattern-bearing substrate and a touch panel sensor obtained using this method.

Solution to Problem

In order to achieve the above-described object, the present invention provides a conductive pattern formation method including a first exposure step of radiating active light in a patterned manner to a photosensitive layer including a photosensitive resin layer provided on a substrate and a conductive film provided on a surface of the photosensitive resin layer on a side opposite to the substrate; a second exposure step of radiating active light, in the presence of oxygen, to some or all of the portions of the photosensitive layer not exposed at least in the first exposure step; and a development step of developing the photosensitive layer to form a conductive pattern following the second exposure step.

According to the conductive pattern formation method of the present invention, portions exposed in the first exposure step can be made to serve as a resin cured layer including a conductive film, i.e., a conductive pattern, and portions, among the portions exposed in the second exposure step, other than the portions exposed in the first exposure step can be made to serve as a resin cured layer not including the conductive film. As the result of the resin cured layer not including the conductive film being provided on the substrate along with the conductive pattern, it is possible to make the step difference of the conductive pattern smaller, compared with a case in which only the conductive pattern is provided on the substrate.

The present inventors et al. presume that the reason for the above-described effect being exerted by the method according to the present invention is that the curing of the side opposite to the substrate of the photosensitive layer is disturbed as the result of the second exposure step being carried out in the presence of oxygen and, thus, a surface layer part of the photosensitive layer is cured only to the extent of the conductive film being possibly removed, even if the portions not exposed in the first exposure step are exposed in the second exposure step.

In addition, adhesiveness of the conductive pattern obtained by the conductive pattern formation method of the present invention to the substrate can be sufficiently ensured by the resin cured layer.

In the conductive pattern formation method according to the present invention, the photosensitive layer is preferably provided by laminating a photosensitive conductive film including a support film, a conductive film provided on the support film, and a photosensitive resin layer provided on the conductive film, so that the photosensitive resin layer abuts the substrate.

In this case, it is possible to more simply and conveniently form the photosensitive layer on the substrate and, thereby, improve productivity. In addition, the smoothness of a surface of the photosensitive layer on the opposite side of the substrate can be improved, and therefore, the smoothness of a conductive pattern to be formed can also be improved by transferring the conductive film and the photosensitive resin layer provided on the support film.

In the conductive pattern formation method according to the present invention, the first exposure step is preferably a step of radiating active light to the photosensitive layer with the support film, and the second exposure step is preferably a step of radiating active light to the photosensitive layer wherefrom the support film is removed.

In this case, the portions exposed in the first exposure step are less susceptible to the effects of oxygen, and therefore, become easier to cure. In addition, the effect of blocking curing by oxygen becomes easier to obtain for portions, among the portions exposed in the second exposure step, other than the portions exposed in the first exposure step. Consequently, it becomes easy to form a conductive pattern small in step difference with a sufficiently high resolution.

In the conductive pattern formation method according to the present invention, the conductive film can contain at least one type of conductive material selected from the group consisting of inorganic conductive materials and organic conductive materials.

In addition, the conductive film preferably contains conductive fiber. As the result of the conductive film containing conductive fiber, it is possible to satisfy both conductivity and transparency. Thus, developability is improved further, thereby enabling the formation of a conductive pattern superior in resolution.

Yet additionally, the conductive fiber is preferably silver fiber. Using silver fiber makes it easy to adjust the conductivity of a conductive pattern to be formed.

The conductive film can contain at least one type of conductive material selected from the group consisting of polythiophene, a polythiophene derivative, polyaniline, and a polyaniline derivative. In this case, sufficient conductivity can be obtained even for a thin film which can be easily removed in a development step.

In the conductive pattern formation method according to the present invention, the photosensitive resin layer preferably contains a binder polymer, a photopolymerizable compound including ethylenically unsaturated bonds, and a photopolymerization initiator. As the result of the photosensitive resin layer containing the abovementioned constituents, it is possible to further improve adhesiveness between the substrate and the conductive pattern and patternability.

The present invention also provides a conductive pattern-bearing substrate including a substrate and a conductive pattern formed thereon by the conductive pattern formation method of the present invention.

According to the conductive pattern-bearing substrate in accordance with the present invention, the conductive pattern is formed by the conductive pattern formation method of the present invention and is, therefore, difficult to recognize visually. Also according to the conductive pattern-bearing substrate in accordance with the present invention, the conductive pattern is small in step difference. Accordingly, the possibility of air bubbles being caught up due to a step difference can be reduced when films, such as a photosensitive conductive film, a visibility-enhancing film (OCA: Optical Clear Adhesive) and an index matching film (IMF), are laminated on the conductive pattern.

According to the conductive pattern-bearing substrate in accordance with the present invention, it is possible to obtain an image display apparatus the image display area or the sensing area of which is less likely to be recognized visually.

The present invention also provides a touch panel sensor including a conductive pattern-bearing substrate according to the present invention.

The touch panel sensor according to the present invention includes a conductive pattern-bearing substrate in accordance with the present invention, and can therefore have excellent visibility and esthetically favorable appearance.

Advantageous Effect of Invention

According to the present invention, it is possible to provide a conductive pattern formation method capable of forming a conductive pattern small in step difference on a substrate, and a conductive pattern-bearing substrate and a touch panel sensor obtained using this method.

DESCRIPTION OF EMBODIMENTS

Figure 1:
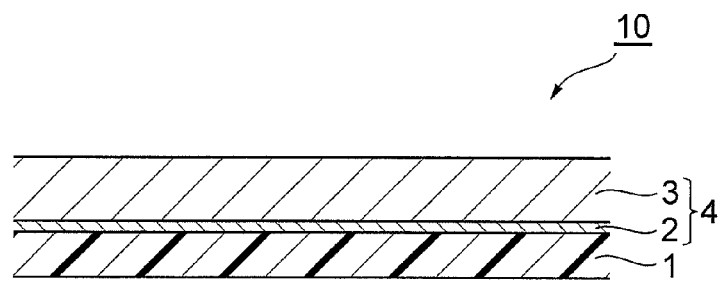
FIG. 1 is a schematic cross-sectional view illustrating one embodiment of a photosensitive conductive film.

Hereinafter, preferred embodiments of the present invention will be described. Note that "(meth)acrylate" as used herein refers to "acrylate" and "methacrylate" corresponding thereto. Likewise, "(meth)acrylic" refers to "acrylic" and "methacryl" corresponding thereto, whereas "(meth)acrylic acid" refers to "acrylic acid" or "methacrylic acid," and "(meth)acryloyl" refers to "acryloyl" and "methacryloyl" corresponding thereto. In addition, "(meth)acrylic acid arkyl ester" refers to "acrylic acid arkyl ester" and "methacrylic acid arkyl ester" corresponding thereto. Yet additionally, "EO" denotes ethylene oxide, and an "EO-modified" compound refers to a compound having an ethylene oxide group-based block structure. Likewise, "PO" denotes propylene oxide, and a "PO-modified" compound refers to a compound having a propylene oxide group-based block structure.

A conductive pattern formation method according to the present invention includes a first exposure step of radiating active light in a patterned manner to a photosensitive layer including a photosensitive resin layer provided on a substrate and a conductive film provided on a surface of the substrate on the opposite side of the photosensitive resin layer; a second exposure step of radiating active light, in the presence of oxygen, to some or all of the portions of the photosensitive layer not exposed at least in the first exposure step; and a development step of developing the photosensitive layer to form a conductive pattern following the second exposure step.

In the present specification, the boundary between the conductive film and the photosensitive resin layer need not necessarily be well-defined. The conductive film has only to make the conductive property thereof available in the planar direction of the photosensitive layer. Accordingly, the boundary may be in a state in which the conductive film and the photosensitive resin layer are mixed with each other. For example, the conductive film may be impregnated with constituents composing the photosensitive resin layer. Alternatively, constituents composing the photosensitive resin layer may be present on a surface of the conductive film.

According to the above-described method, portions exposed in the first exposure step can be made to serve as a resin cured layer including a conductive film, i.e., a conductive pattern, and portions, among the portions exposed in the second exposure step, other than the portions exposed in the first exposure step can be made to serve as a resin cured layer not including the conductive film. As the result of the resin cured layer not including the conductive film being provided on the substrate along with the conductive pattern, it is possible to make the step differences of the conductive pattern smaller, compared with a case in which only the conductive pattern is provided on the substrate.

The present inventors et al. presume that the reason for the above-described effect being exerted by the method described above is that the curing of portions of the photosensitive layer on the opposite side of the substrate is disturbed as the result of the second exposure step being carried out in the presence of oxygen and, thus, a surface layer part of the photosensitive layer is cured only to the extent of the conductive film being possibly removed, even if portions of the photosensitive layer not exposed in the first exposure step are exposed in the second exposure step. From such a point of view as described above, the photosensitive resin layer preferably contains a photopolymerization initiator the activity of which is decreased by oxygen. It is therefore preferable to use a radical polymerization initiator.

In the present embodiment, the photosensitive layer can be provided by laminating a photosensitive conductive film including a support film, a conductive film provided on the support film, and a photosensitive resin layer provided on the conductive film, so that the photosensitive resin layer abuts the substrate. Then, the first exposure step can be defined as a step of radiating active light to the photosensitive layer with the support film, and the second exposure step can be defined as a step of radiating active light to the photosensitive layer wherefrom the support film is removed. Hereinafter, this embodiment will be described.

FIG. 1 is a schematic cross-sectional view illustrating one preferred embodiment of a photosensitive conductive film used in the present embodiment. A photosensitive conductive film 10 illustrated in FIG. 1 includes a support film 1 and a photosensitive layer 4 provided thereon. The photosensitive layer 4 is composed of a conductive film 2 provided on the support film 1 and a photosensitive resin layer 3 provided on the conductive film 2.

As the support film 1, a polymeric film can be used and a polymeric film having resistance to heat and solvents is preferred. Examples of such a polymeric film include a polyethylene terephthalate film, a polyethylene film, a polypropylene film, and a polycarbonate film. Among these films, a polyethylene terephthalate film is preferred from the viewpoint of transparency and heat resistance.

The above-described polymeric film may be a film pre-treated for mold releasing, so that the film can be easily delaminated later from the photosensitive layer 4.

If the support film 1 is to be delaminated in the second exposure step, the support film 1 may further include such a layer as a gas barrier layer.

The thickness of the support film 1 is preferably 5 μm or greater, more preferably 10 μm or greater, and even more preferably 15 μm or greater from the viewpoint of mechanical strength. By setting the thickness of the support film 1 to the abovementioned values or greater, it is possible to prevent the support film 1 from being broken in a step of, for example, coating a conductor-dispersed solution or a conductor solution to form the conductive film 2, coating a photosensitive resin composition to form the photosensitive resin layer 3, or delaminating the support film 1 from the photosensitive layer 4 at the time of carrying out the second exposure step. In addition, from the viewpoint of ensuring an adequate level of resolution of the conductive pattern when active light is radiated to the photosensitive resin layer 3 through the support film 1, the thickness of the support film 1 is preferably 300 μm or less, more preferably 200 μm or less, and even more preferably 100 μm or less.

From the above-described viewpoints, the thickness of the support film 1 is preferably 5 to 300 μm, more preferably 10 to 200 μm, and even more preferably 15 to 100 μm.

From the viewpoint of being able to improve sensitivity and resolution, the haze value of the support film 1 is preferably 0.01 to 5.0%, more preferably 0.01 to 3.0%, particularly preferably 0.01 to 2.0%, and extremely preferably 0.01 to 1.5%. Note that the haze value can be measured in conformity with JIS K 7105 by using a commercially-available turbidity meter, such as NDH-1001DP (trade name of a product made by Nippon Denshoku Industries Co., Ltd.).

The conductive film 2 can contain at least one type of conductive material selected from the group consisting of an inorganic conductive material and an organic conductive material. An inorganic conductive material and an organic conductive material can be used without any particular restrictions, as long as the conductive property of the conductive film 2 is available. These conductive materials can be used either singularly or in combinations of two or more thereof.

Examples of the inorganic conductive material include metal fiber to be described later. Examples of the organic conductive material include a conductive polymer. As the conductive polymer, it is possible to use at least one type of conductive material selected from the group consisting of polythiophene, a polythiophene derivative, polyaniline, and a polyaniline derivative. For example, it is possible to use one type of material or two or more types of materials in combination, among polyethylenedioxythiophene, polyhexylthiophene and polyaniline. If the conductive film 2 is composed by including an organic conductive material, the conductive film 2 preferably contains the organic conductive material and a photosensitive resin.

The conductive film 2 preferably contains conductive fiber. As the result of the conductive film containing conductive fiber, it is possible to satisfy both conductivity and transparency. Thus, developability is improved further, thereby enabling the formation of a conductive pattern superior in resolution.

Examples of the abovementioned conductive fiber include metal fiber, such as gold fiber, silver fiber and platinum fiber, and carbon fiber, such as a carbon nanotube. These types of fiber can be used either singularly or in combinations of two or more thereof. From the viewpoint of conductivity, it is preferable to use gold fiber and/or silver fiber. From the viewpoint of being able to easily adjust the conductivity of the conductive film, it is more preferable to use silver fiber.

The abovementioned metal fiber can be prepared by, for example, a method for reducing metal ions with a reducing agent, such as $NaBH_4$, or a polyol method. In addition, as the abovementioned carbon nanotube, it is possible to use a commercially-available product, such as the Hipco monolayer carbon nanotube from Unidym, Inc.

The fiber diameter of the conductive fiber is preferably 1 nm to 50 nm, more preferably 2 nm to 20 nm, and particularly preferably 3 nm to 10 nm. In addition, the fiber length of the conductive fiber is preferably 1 μm to 100 μm, more preferably 2 μm to 50 μm, and particularly preferably 3 μm to 10 μm. The fiber diameter and the fiber length can be measured with a scanning electron microscope.

Figure 2:
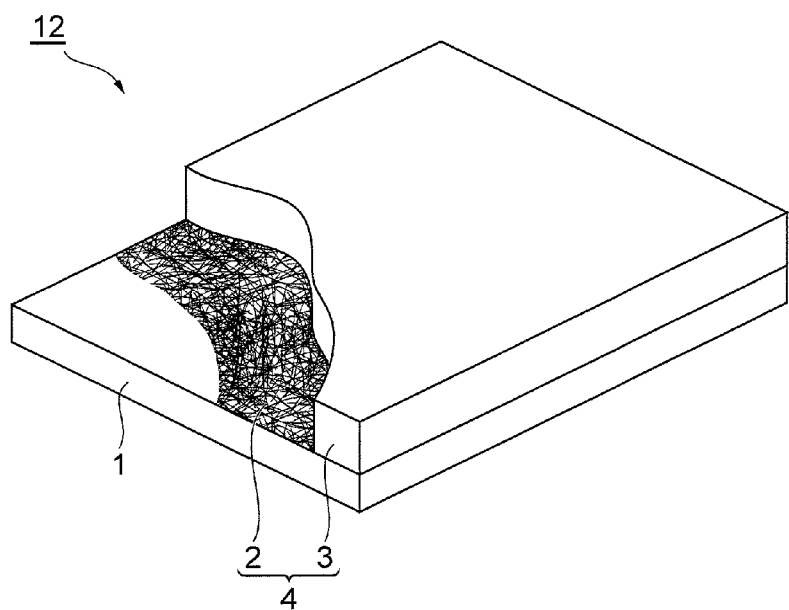
FIG. 2 is a partially cutaway perspective view illustrating one embodiment of a photosensitive conductive film.

FIG. 2 is a partially cutaway perspective view illustrating one embodiment of a photosensitive conductive film. The conductive film 2 preferably has a mesh structure in which conductive fiber components have contact with one another, as illustrated in FIG. 2. The conductive film 2 having such a mesh structure may be formed on a surface of the photosensitive resin layer 3 on the support film 1 side. Alternatively, however, the conductive film 2 may be formed in the manner that part of the photosensitive resin layer 3 taps into the conductive film 2, or in the manner that the conductive film 2 is included in a surface layer of the photosensitive resin layer 3 on the support film 1 side, as long as the conductive property of the conductive film 2 is available in the planar direction of a surface of the photosensitive layer 4 to be exposed when the support film 1 is delaminated.

The conductive film 2 can be formed by, for example, coating a conductor-dispersed solution or a conductor solution containing one or more of the abovementioned inorganic conductive material and organic conductive material, water and/or an organic solvent, and, as necessary, a dispersion stabilizer, such as a surface-activating agent, on the support film 1, and then drying the solution. Coating can be performed using a heretofore-known method, such as a roll coating method, a comma coating method, a gravure coating method, an air knife coating method, a die coating method, a bar coating method, or a spray coating method. In addition, drying can be performed at 30 to 150° C. for 1 to 30 minutes using, for example, a hot-air convection drying machine. In the conductive film 2, an inorganic conductive material and an organic conductive material may be coexistent with a surface-activating agent and a dispersion stabilizer. The conductive film 2 may be composed of a plurality of films obtained by coating and drying a plurality of conductor-dispersed solutions or conductor solutions in order on the support film 1.

The thickness of the conductive film 2, though different depending on the purpose of use and the required conductivity of a conductive pattern to be formed, is preferably 1 μm or less, more preferably 1 nm to 0.5 μm, and even more preferably 5 nm to 0.1 μm. The conductive film 2 having a thickness of 1 μm or less is sufficiently high in optical transmittance at a wavelength band of 450 to 650 nm and superior in pattern formability, and therefore, is particularly suited for the fabrication of transparent electrodes. Note that the thickness of the conductive film 2 refers to a value measured using scanning electron microscope photograph.

In the present embodiment, the photosensitive resin layer 3 is additionally provided after the conductive film 2 is formed on the support film 1. Alternatively, however, the conductive film 2 formed on the support film 1 may be laminated, as necessary, on the photosensitive resin layer provided on the substrate.

The photosensitive resin layer 3 can be formed from (a) a binder polymer, (b) a photopolymerizable compound having ethylenically unsaturated bonds, and (c) a photosensitive resin composition containing a photopolymerization initiator. As the result of the photosensitive resin layer 3 containing the abovementioned constituents, it is possible to further improve adhesiveness between the substrate and the conductive pattern and the patternability thereof.

Examples of the (a) binder polymer include acrylic resin, styrene resin, epoxy resin, amide resin, amide epoxy resin, alkyd resin, phenol resin, ester resin, urethane resin, epoxy acrylate resin obtained by reaction between epoxy resin and (meth)acrylic acid, and acid-modified epoxy acrylate resin obtained by the reaction between epoxy acrylate resin and acid anhydride. These types of resin can be used either singularly or in combinations of two or more thereof.

Acrylic resin, among the abovementioned types of resin, is preferably used from the viewpoint of superiority in alkaline developability and film formability. It is more preferable for the abovementioned acrylic resin to have a monomer unit deriving from (meth)acrylic acid and (meth)acrylic acid arkyl ester as the constituent unit of the resin. Here, "acrylic resin" refers to a polymer primarily having a monomer unit deriving from a polymerizable monomer having (meth)acrylic groups.

The above-described acrylic resin is manufactured by, for example, subjecting a polymerizable monomer having (meth) acrylic groups to radical polymerization. This acrylic resin can be used either singularly or in combinations of two or more types thereof.

Examples of the abovementioned polymerizable monomer having (meth)acrylic groups include acrylamide, such as diacetone acrylamide, (meth)acrylic acid arkyl ester, (meth) acrylic acid tetrahydrofurfuryl ester, (meth)acrylic acid dimethylaminoethyl ester, (meth)acrylic acid diethylaminoethyl ester, (meth)acrylic acid glycidyl ether, 2,2,2-trifluoroethyl (meth)acrylate, 2,2,3,3-tetrafluoropropyl(meth)acrylate, (meth)acrylic acid, α-bromo(meth)acrylic acid, α-chlor (meth)acrylic acid, β-furyl(meth)acrylic acid, and β-styryl (meth)acrylic acid.

The acrylic resin may be copolymerized with one or more polymerizable monomers, including polymerizable styrene derivatives substituted at the α-position or aromatic ring, such as styrene, vinyl toluene and α-methylstyrene, acrylonitrile, esters of vinyl alcohol, such as vinyl-n-butyl ether, maleic acid monoesters, such as maleic acid, a maleic acid anhydride, monomethyl maleate, monoethyl maleate and monoisopropyl maleate, fumaric acid, cinnamic acid, α-cyanocinnamic acid, itaconic acid, and crotonic acid, in addition to such polymerizable monomers having (meth)acrylic groups as described above.

Examples of the (meth)acrylic acid arkyl ester include a (meth)acrylic acid methyl ester, a (meth)acrylic acid ethyl ester, (meth)acrylic acid propyl ester, a (meth)acrylic acid butyl ester, (meth)acrylic acid pentyl ester, a (meth)acrylic acid hexyl ester, (meth)acrylic acid heptyl ester, a (meth) acrylic acid octyl ester, a (meth)acrylic acid 2-ethylhexyl ester, a (meth)acrylic acid nonyl ester, a (meth)acrylic acid decyl ester, a (meth)acrylic acid undecyl ester, and a (meth) acrylic acid dodecyl ester. These esters can be used either singularly or in combinations of two or more thereof.

From the viewpoint of improving alkaline developability, the (a) binder polymer preferably has carboxyl groups. Examples of a polymerizable monomer having carboxyl groups used to obtain such a binder polymer include those types of (meth)acrylic acid which are mentioned above.

As the ratio of the polymerizable monomer having carboxyl groups to all of the polymerizable monomers used in order to obtain the binder polymer, the ratio of the carboxyl groups that the (a) binder polymer has is preferably 10 to 50% by mass, more preferably 12 to 40% by mass, particularly preferably 15 to 30% by mass, and extremely preferably 15 to 25% by mass. From the viewpoint of superiority in alkaline developability, the ratio is preferably 10% by mass or higher, but is preferably 50% by mass or lower from the viewpoint of superiority in alkaline resistance.

From the viewpoint of improving developability with respect to various types of heretofore-known developing solutions in a development step, the acid number of the (a) binder polymer is preferably 50 mg KOH/g or greater but not greater than 150 mg KOH/g.

The acid number of the (a) binder polymer can be measured in the following manner. 1 g of a binder polymer the acid number of which is to be measured is precisely weighed.

30 g of acetone is added to the binder polymer and uniformly dissolved therein. Then, an adequate dose of phenolphthalein which is an indicator is added to the solution, and titration is performed using 0.1 N of a KOH aqueous solution.

The acid number can thus be measured. Note that the acid number can be calculated using the following equation.

$$\text{Acid number} = 10 \times Vf \times 56.1/(Wp \times I)$$

In the equation, Vf represents the titer (mL) of phenolphthalein, Wp represents the weight (g) of a measured resin solution, and I represents the ratio of the nonvolatile content (% by mass) of the measured resin solution.

Note that if the binder polymer contains a synthetic solvent or a diluent solvent, the binder polymer is previously heated for 1 to 4 hours at temperature approximately 10° C. higher than the boiling point of the solvent before precise weighing to remove volatile content. At this time, volatile constituents, such as a low-molecular-weight photopolymerizable compound, may also be removed in some cases.

From the viewpoint of achieving the balance between mechanical strength and alkaline developability, the weight-average molecular weight of the (a) binder polymer is preferably 5,000 to 300,000, more preferably 20,000 to 150,000, and particularly preferably 30,000 to 100,000. From the viewpoint of superiority in resistance to developing solutions, the weight-average molecular weight is preferably 5,000 or greater. From the viewpoint of developing time, the weight-average molecular weight is preferably 300,000 or less. Note that the measurement conditions of the weight-average molecular weight are defined as being the same as those of the embodiments of the present specification.

As the (a) binder polymer, the abovementioned types of resin can be used either singularly or in combinations of two or more thereof. Examples of the binder polymer for which two or more types of resin are used in combination include a binder polymer made from an intermixture containing two or more types of resin composed of dissimilar copolymerization constituents, a binder polymer made from an intermixture containing two or more types of resin different in weight-average molecular weight, and a binder polymer made from an intermixture containing two or more types of resin different in dispersivity.

Examples of the (b) photopolymerizable compound having ethylenically unsaturated bonds include urethane monomers, such as a compound obtained by reacting α,β-unsaturated carboxylic acid with polyvalent alcohol, a compound obtained by reacting α,β-unsaturated carboxylic acid with a glycidyl-containing compound, and a (meth)acrylate compound having urethane bonds, phthalic acid-based compounds, such as γ-chloro-β-hydroxypropyl-β'-(meth)acryloyloxyethyl-o-phthalate, β-methacrylate-β'-(meth) acryloyloxyethyl-o-phthalate, and β-hydroxypropyl-β'-(meth)acryloyloxyethyl-o-phthalate, and (meth)acrylic acid arkyl ester. These compounds are used either singularly or in combinations of two or more thereof.

Examples of the compound obtained by reacting α,β-unsaturated carboxylic acid with polyvalent alcohol include bisphenol A-based (meth)acrylate compounds, such as 2,2-bis(4-((meth)acryloxy polyethoxy)phenyl) propane, 2,2-bis (4-((meth)acryloxy polypropoxy)phenyl) propane, and 2,2-bis(4-((meth)acryloxy polyethoxy polypropoxy)phenyl) propane, polyethylene glycol di(meth)acrylate whose number of ethylene groups is 2 to 14, polypropylene glycol di(meth)acrylate whose number of propylene groups is 2 to 14, polyethylene polypropylene glycol di(meth)acrylate, trimethylol propane di(meth)acrylate, trimethylolpropane tri (meth)acrylate, trimethylolpropane ethoxy tri(meth)acrylate, trimethylolpropane diethoxy tri(meth)acrylate, trimethylolpropane triethoxy tri(meth)acrylate, trimethylolpropane tetraethoxy tri(meth)acrylate, trimethylolpropane pentaethoxy tri(meth)acrylate, tetramethylolmethane tri(meth)acrylate, and tetramethylolmethane tetra(meth)acrylate whose number of ethylene groups is 2 to 14 and whose number of propylene groups is 2 to 14, and polypropylene glycol di(meth)acrylate, dipentaerythritol penta(meth)acrylate, and dipentaerythritol hexa(meth)acrylate whose number of propylene groups is 2 to 14.

Examples of the urethane monomers include products of additional reaction of a (meth)acrylic monomer having hydroxyl groups in the α position thereof with diisocyanate compounds, such as isophorone diisocyanate, 2,6-toluene diisocyanate, 2,4-toluene diisocyanate, and 1,6-hexamethylene diisocyanate, tris[(meth)acryloxy tetraethylene glycol isocyanate]hexamethylene isocyanurate, EO-modified urethane di(meth)acrylate, and EO,PO-modified urethane di(meth)acrylate.

Examples of the EO-modified urethane di(meth)acrylate include "UA-11" (trade name of a product made by Shin-Nakamura Chemical Co., Ltd.). In addition, examples of the EO,PO-modified urethane di(meth)acrylate include "UA-13" (trade name of a product made by Shin-Nakamura Chemical Co., Ltd.).

The content ratio of the (b) photopolymerizable compound having ethylenically unsaturated bonds to the total amount of 100 parts by mass of the (a) binder polymer and the (b) photopolymerizable compound having ethylenically unsaturated bonds is preferably 30 to 80 parts by mass, and more preferably 40 to 70 parts by mass. From the viewpoint of superiority in photocurability and coatability on the conductive film 2 formed, the content ratio is preferably 30 parts by mass or higher. From the viewpoint of superiority in storage stability when the compound is wound up into the form of a film, the content ratio is preferably 80 parts by mass or lower.

The (c) photopolymerization initiator is not limited in particular, as long as the photosensitive resin layer 3 can be cured by the radiation of active light. From the viewpoint of superiority in photocurability, however, it is preferable to use a radical polymerization initiator. Examples of the polymerization initiator include aromatic ketones, such as benzophenone, N,N'-tetramethyl-4,4'-diamino benzophenone (Michiler's ketone), N,N'-tetraethyl-4,4'-diamino benzophenone, 4-methoxy-4'-dimethylaminobenzophenone, 2-benzyl-2-dimethylamino-1-(4-morpholinophenyl)-butanone-1, and 2-methyl-1-[4-(methylthio)phenyl]-2-morpholino-propanone-1; benzoin ether compounds, such as benzoin methyl ether, benzoin ethyl ether, and benzoin phenyl ether; benzoin compounds, such as benzoin, methylbenzoin, and ethylbenzoin; oxime ester compounds, such as 1,2-octanedione-1-[4-(phenylthio)phenyl]-2-(O-benzoyl oxime), and 1-[9-ethyl-6-(2-methylbenzoyl)-9H-carbazole-3-yl]ethanonel-(O-acetyl oxime); benzyl derivatives, such as benzil ketal; 2,4,5-triarylimidazole dimers, such as 2-(o-chlorophenyl)-4,5-diphenyl imidazole dimer, 2-(o-chlorophenyl)-4,5-di-(methoxyphenyl) imidazole dimer, 2-(o-fluorophenyl)-4,5-diphenyl imidazole dimer, 2-(o-methoxyphenyl)-4,5-diphenyl imidazole dimer, and 2-(p-methoxyphenyl)-4,5-diphenyl imidazole dimer; acridine derivatives, such as 9-phenylacridine and 1,7-bis(9,9'-acridinyl) heptane; N-phenylglycine, N-phenylglycine derivatives, coumarin-based compounds, and oxazole-based compounds. In addition, either identical and symmetrical compounds or different and asymmetrical compounds may be provided as substituents for the two aryl groups of 2,4,5-triarylimidazole. Alternatively, a thioxanthone-based compound and a tertiary amine compound may be combined like a combination of diethyl thioxanthone and dimethylaminobenzoic acid.

From the viewpoint of transparency, the photopolymerization initiator preferably contains an aromatic ketone compound or an oxime ester compound, among these compounds. It is therefore preferable for the photopolymerization initiator to contain 2-benzyl-2-dimethylamino-1-(4-morpholinophenyl)-butanone-1 or 1,2-octanedione-1-[4-(phenylthio)phenyl]-2-(O-benzoyl oxime). These compounds are used either singularly or in combinations of two or more thereof.

The content ratio of the (c) photopolymerization initiator to the total amount of 100 parts by mass of the (a) binder polymer and the (b) photopolymerizable compound having ethylenically unsaturated bonds is preferably 0.1 to 20 parts by mass, more preferably 1 to 10 parts by mass, and particularly preferably 1 to 5 parts by mass. From the viewpoint of superiority in optical sensitivity, the content ratio is preferably 0.1 parts by mass or higher. From the viewpoint of superiority in the internal photocurability of the photosensitive resin layer 3, the content ratio is preferably 20 parts by mass or lower.

The photosensitive resin layer 3 can contain various types of additives, as necessary. As additives, the photosensitive resin layer 3 can contain a plasticizing agent, such as p-toluene sulfonamide, a filling agent, an antifoam agent, a flame retardant, a stabilizing agent, an adhesion-imparting agent, a leveling agent, a delamination accelerator, an antioxidizing agent, an aroma chemical, an imaging agent, and a thermal cross-linking agent, either singularly or in combinations of two or more thereof. The ratio of the amount of each of these additives to the total amount of each of the (a) binder polymer and a photopolymerizable compound of 100 parts by mass is preferably 0.01 to 20 parts by mass.

The photosensitive resin layer 3 can be formed by coating a photosensitive resin composition solution having a solid content of approximately 10 to 60% by mass dissolved, as necessary, in a solvent, such as methanol, ethanol, acetone, methyl ethyl ketone, methyl cellosolve, ethyl cellosolve, toluene, N,N-dimethylformamide, or propylene glycol monomethyl ether, or in a mixed solvent made of these solvents, on the conductive film 2 formed on a support film, and then drying the solution. In this case, however, the amount of organic solvents remaining in the photosensitive resin layer after drying is preferably 2% by mass or smaller, in order to prevent the organic solvents from diffusing in a later step.

Coating can be performed by a heretofore-known method. Examples of the heretofore-known method include a roll coating method, a comma coating method, a gravure coating method, an air knife coating method, a die coating method, a bar coating method, and a spray coating method. After coating, drying for the purpose of removing organic solvents and the like can be performed at 70 to 150° C. for approximately 5 to 30 minutes using a hot-air convection drying machine or the like.

The thickness of the photosensitive resin layer 3, though different depending on the purpose of use, is preferably 1 to 200 μm after drying, more preferably 1 to 15 and particularly preferably 1 to 10 μm. If this thickness is 1 μm or greater, layer formation by coating tends to become easier. If this thickness is 200 μm or less, the photosensitive resin layer 3 has excellent optical transparency and makes sufficient sensitivity available. This thickness is, therefore, preferable from the viewpoint of the photocurability of the photosensitive resin layer 3. The thickness of the photosensitive resin layer 3 can be measured using a scanning electron microscope.

In the photosensitive conductive film 10, the minimum optical transmittance of the photosensitive layer 4 (laminated body formed of the above-described conductive film 2 and photosensitive resin layer 3) in a wavelength band of 450 to 650 nm is preferably 80% or higher, and more preferably 85% or higher. If the photosensitive layer 4 satisfies such conditions, it is easy to make brightness high in display panels and the like. In addition, the optical transmittance in a wavelength band of 450 to 650 nm when the film thickness of the photosensitive layer 4 is set to 1 to 10 μm is preferably 80% or higher, and more preferably 85% or higher. If the photosensitive layer 4 (laminated body formed of the conductive film 2 and the photosensitive resin layer 3) satisfies such conditions, it is easy to make brightness high in display panels and the like.

The photosensitive conductive film 10 used in the present embodiment may further include a protective film provided so as to abut a surface of the photosensitive resin layer 3 on the side opposite to the support film 1.

As the protective film, it is possible to use a polymeric film having resistance to heat and solvents. Examples of the polymeric film include a polyethylene terephthalate film, a polypropylene film, and a polyethylene film. In addition, the same polymeric film as the abovementioned support medium film may be used as the protective film.

The thickness of the protective film is preferably 1 to 100 μm, more preferably 5 to 50 μm, even more preferably 5 to 40 μm, and particularly preferably 15 to 30 μm. From the viewpoint of superiority in mechanical strength, the thickness of the protective film is preferably 1 μm or greater, but is preferably 100 μm or less from the viewpoint of relative inexpensiveness.

The adhesion force between the protective film and the photosensitive resin layer 3 is preferably less than the adhesion force between the support film 1 and the photosensitive layer 4 (the conductive film 2 and the photosensitive resin layer 3), in order to make it easy to delaminate the protective film from the photosensitive resin layer 3.

In addition, the protective film is preferably such that the number of fish-eyes, 80 μm or larger in diameter, contained in the protective film is no larger than 5 pieces/m$^2$. Note that "fish-eye" refers to foreign substances, unresolved substances, oxidative depleted substances, or the like of materials trapped in the film when the materials are thermally fused to manufacture a film by, for example, a kneading method, an extrusion method, a biaxial stretching method, and a casting method.

The photosensitive conductive film 10 may further include such layers as an adhesive layer and a gas barrier layer on the protective film.

The photosensitive conductive film 10 can be stored in a flat plate-like form as it is, for example. Alternatively, the photosensitive conductive film 10 may be wound up around a cylindrical core or the like and stored in a rolled form. Note that at this time, the photosensitive conductive film 10 is preferably wound up so that the support film 1 is on the outermost side.

If the photosensitive conductive film 10 does not include the protective film, such a photosensitive conductive film 10 can be stored in a flat plate-like form as it is.

A winding core is not limited in particular, as long as the core is of a conventionally-used type. Examples of the winding core include plastics, such as polyethylene resin, polypropylene resin, polystyrene resin, polyvinyl chloride resin, and ABS resin (acrylonitrile-butadiene-styrene copolymer). An end face separator is preferably placed on the end face of a photosensitive conductive film wound up into a rolled form, from the viewpoint of protecting the end face. In addition, a moisture-proof end face separator is preferably placed on the end face from the viewpoint of resistance to edge fusion. Yet additionally, it is preferable to wrap the photosensitive conductive film in a low-moisture permeability black sheet when packing the film.

Figure 3:
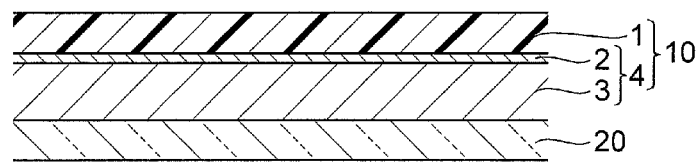
FIG. 3 is a schematic cross-sectional view used to describe one embodiment of a conductive pattern formation method of the present invention.
Figure 3:
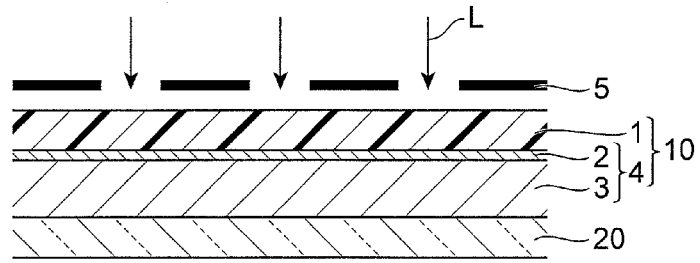
Figure 3:
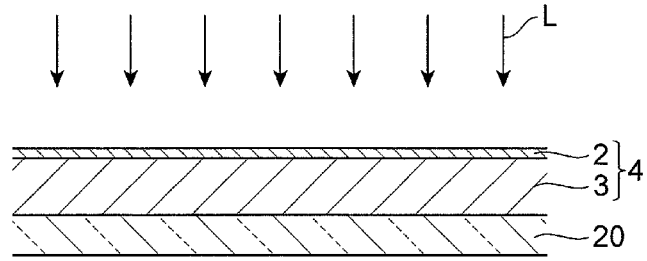
Figure 3:
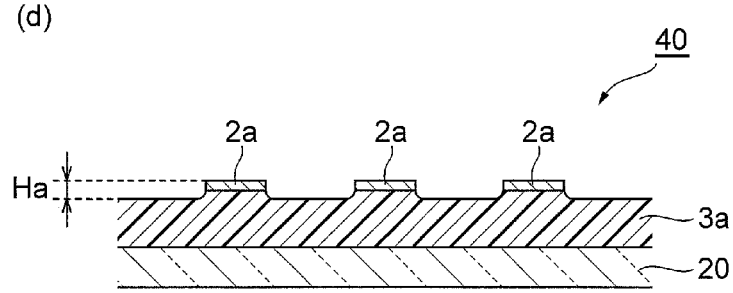

FIG. 3 is a schematic cross-sectional view used to describe a conductive pattern formation method according to the present embodiment. The method of the present embodiment includes a lamination step (FIG. 3(a)) of laminating the above-described photosensitive conductive film 10, so that the photosensitive resin layer 3 abuts the substrate 20; a first exposure step (FIG. 3(b)) of radiating active light to predetermined portions of the photosensitive layer 4 with the support film 1; a second exposure step (FIG. 3(c)) of delaminating the support film 1 thereafter, and then radiating active light, in the presence of oxygen, to portions exposed in the first exposure step and to some or all of the portions not exposed in the first exposure step; and a development step (FIG. 3(d)) of developing the photosensitive layer 4 following the second exposure step.

Examples of the substrate 20 include a glass substrate, and a plastic substrate, such as a polycarbonate substrate. The thickness of the substrate 20 can be selected as appropriate, according to the purpose of use, and therefore, a filmy substrate may be used. Examples of the filmy substrate include a polyethylene terephthalate film, a polycarbonate film, and a cycloolefin polymer film. The minimum optical transmittance of the substrate 20 in a wavelength band of 450 to 650 nm is preferably 80% or higher. If the substrate 20 satisfies such conditions, it is easy to make brightness high in display panels and the like.

Examples of the lamination step include a method of laminating the photosensitive conductive film 10 by pressure-bonding the photosensitive resin layer 3 side thereof onto the substrate 20, while heating the film, after removing a protective film, if there is any. Note that in this step, the photosensitive conductive film 10 is preferably laminated under reduced pressure from the viewpoint of adhesiveness and conformability. In the lamination of the photosensitive conductive film 10, the photosensitive resin layer 3 and/or the substrate 20 is preferably heated to 70 to 130° C., and the pressure-bonding pressure is preferably set to approximately 0.1 to 1.0 MPa (approximately 1 to 10 kgf/cm$^2$). No particular limitations apply to these conditions, however. The substrate 20 need not be preheat-treated as long as the photosensitive resin layer 3 is heated to 70 to 130° C., as described above. It is possible to preheat-treat the substrate 20, however, in order to further improve laminability.

According to the method of the present embodiment, the separately fabricated photosensitive conductive film 10 is laminated on the substrate 20 to provide the photosensitive layer 4. Consequently, the photosensitive layer 4 can be more simply and conveniently formed on the substrate 20 and productivity can thus be improved.

Examples of the exposure method in the first exposure step include a method (mask exposure method) of radiating active light L imagewise through such a negative or positive mask pattern 5 referred to as an artwork as illustrated in FIG. 3(b).

Examples of a light source of active light used in the first exposure step include a heretofore-known light source. For example, a carbon arc lamp, a mercury-vapor arc lamp, an ultrahigh-pressure mercury lamp, a high-pressure mercury lamp, or a xenon lamp capable of effectively emitting ultraviolet light, visible light, or the like is used as the light source. An Ar ion laser or a semiconductor laser is also used alternatively. Yet alternatively, a lamp, such as a photoflood bulb or a solar lamp, capable of effectively emitting visible light is also used. It is also allowed to adopt a method of radiating active light imagewise by a direct drawing method using a laser exposure method or the like.

Exposure intensity in the first exposure step, though different depending on equipment to be used and the composition of photosensitive resin constituents, is preferably 5 mJ/cm$^2$ to 1000 mJ/cm$^2$, and more preferably 10 mJ/cm$^2$ to 200 mJ/cm$^2$. From the viewpoint of superiority in photocurability, the exposure intensity is preferably 10 mJ/cm$^2$ or higher, but is preferably 200 mJ/cm$^2$ or lower from the viewpoint of resolution.

In the present embodiment, effects of oxygen are reduced and the photosensitive layer 4 is made easy to be cured as the result of the photosensitive layer 4 being exposed without delaminating the support film 1.

The first exposure step can be carried out in air, vacuum or the like, and thus, the ambient atmosphere of exposure is not limited in particular.

Figure 4:
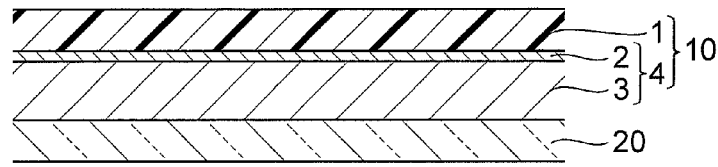
FIG. 4 is a schematic cross-sectional view used to describe another embodiment of the conductive pattern formation method of the present invention.
Figure 4:
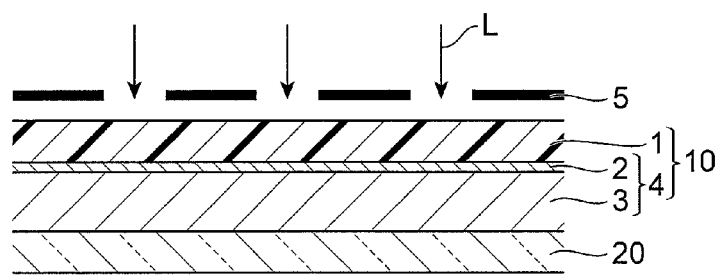
Figure 4:
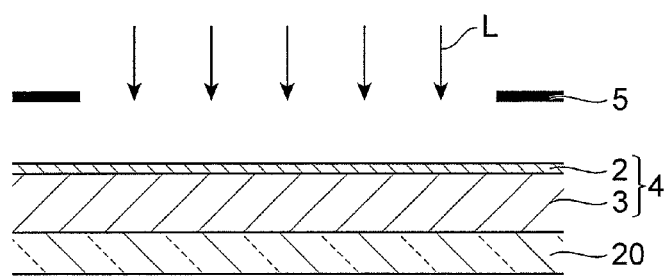
Figure 4:
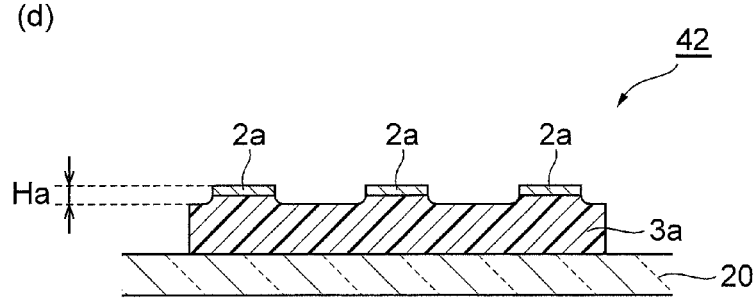

As an exposure method in the second exposure step, a mask exposure method or a method of radiating active light to the entire area of the photosensitive resin layer 3 without using a mask, as illustrated in FIG. 3(c), can be selected as necessary. If the mask exposure method is implemented, active light L can be radiated imagewise through the mask pattern 5, for example, as illustrated in FIG. 4(c).

In the present embodiment, portions exposed in the first exposure step are also exposed in the second exposure step. By performing exposure twice as described above, it is possible to prevent a boundary from being produced between the portions exposed in the first exposure step and portions exposed in the second exposure step, compared with a case in which the portions exposed in the first exposure step are not exposed in the second exposure step. Thus, a step difference can be prevented from becoming larger. Note that if the exposed portions are sufficiently cured in the first exposure step, those portions need not be exposed in the second exposure step.

As a light source of active light used in the second exposure step, there is used a heretofore-known light source, such as a carbon arc lamp, a mercury-vapor arc lamp, an ultrahigh-pressure mercury lamp, a high-pressure mercury lamp or a xenon lamp, capable of effectively emitting ultraviolet light, visible light, or the like. An Ar ion laser or a semiconductor laser capable of effectively emitting ultraviolet light, visible light, or the like is also used alternatively. Yet alternatively, a light source, such as a photoflood bulb or a solar lamp, capable of effectively emitting visible light is also used.

Exposure intensity in the second exposure step, though different depending on equipment to be used and the composition of photosensitive resin constituents, is preferably 5 mJ/cm$^2$ to 1000 mJ/cm$^2$, and more preferably 10 mJ/cm$^2$ to 200 mJ/cm$^2$, and even more preferably 30 mJ/cm$^2$ to 150 mJ/cm$^2$. From the viewpoint of superiority in photocurability, the exposure intensity is preferably 10 mJ/cm$^2$ or higher, but is preferably 200 mJ/cm$^2$ or lower from the viewpoint of work efficiency.

In the second exposure step according to the present embodiment, the photosensitive layer 4 is exposed in the presence of oxygen after the support film 1 is removed to deactivate reactive species produced from an initiator with oxygen on the exposed surface side of the photosensitive layer 4 (the conductive film 2 and the photosensitive resin layer 3). Thus, it is possible to provide an insufficiently cured region on the conductive film 2 side of the photosensitive resin layer 3. Since overexposure causes the photosensitive resin constituents as a whole to fully cure, it is preferable to set exposure intensity in the second exposure step to within the above-described ranges.

The second exposure step is carried out in the presence of oxygen and is preferably carried out in, for example, air. The second exposure step may be carried out under the condition of an increased oxygen concentration.

In a development step according to the present embodiment, an insufficiently-cured surface part of the photosensitive resin layer 3 exposed in the second exposure step is removed. Specifically, the insufficiently-cured surface part of the photosensitive resin layer 3, i.e., a surface layer thereof including the conductive film 2 is removed by wet development. Consequently, the conductive film 2 having a predetermined pattern remains on the resin cured layer of a region exposed in the first and second exposure steps, and a resin cured layer not including the conductive film 2 is formed in a portion of the photosensitive resin layer 3 removed in the development step. In this way, a step difference Ha of a conductive pattern 2a formed on a resin cured layer 3a is made small, as illustrated in FIG. 3(d). Thus, there is obtained a conductive pattern-bearing substrate 40 having a conductive pattern small in step difference.

Note that if a mask exposure method is implemented in the second exposure step, there is obtained a conductive pattern-bearing substrate 42 in which portions not exposed in the first and second exposure steps are removed by development, as illustrated in FIG. 4(d).

Wet development is performed by a heretofore-known method, such as spraying, fluctuating immersion, brushing, or slapping using, for example, an alkaline aqueous solution, an aqueous developing solution, or an organic solvent-based developing solution.

As a developing solution, an alkaline aqueous solution is preferably used since the solution is safe, stable, and superior in handleability. As an alkaline aqueous solution, a 0.1 to 5% by mass sodium carbonate aqueous solution, a 0.1 to 5% by mass carbonic acid potassium aqueous solution, a 0.1 to 5% by mass sodium hydroxide aqueous solution, a 0.1 to 5% by mass sodium tetraborate aqueous solution, or the like is preferred. In addition, the pH value of the alkaline aqueous solution used for development is preferably within the range of 9 to 11. The temperature of the alkaline aqueous solution is adjusted in accordance with the developability of a photosensitive resin layer. A surface-active agent, an antifoam agent, a small amount of development-promoting organic solvent, and the like may be mixed in the alkaline aqueous solution.

It is possible to use an aqueous developing solution composed of water or an alkaline aqueous solution and one or more types of organic solvents. Here, examples of a base contained in the alkaline aqueous solution include borax, sodium metasilicate, tetramethylammonium hydroxide, ethanolamine, ethylene diamine, diethylene triamine, 2-amino-2-hydroxymethyl-1,3-propanediol, 1,3-diaminopropanol-2, and morpholine, in addition to the abovementioned bases.

Examples of organic solvents include methyl ethyl ketone, acetone, ethyl acetate, alkoxymethanol having alkoxy groups of 1 to 4 in carbon number, ethyl alcohol, isopropyl alcohol, butyl alcohol, diethylene glycol monomethyl ether, diethylene glycol monoethyl ether, and diethylene glycol monobutyl ether. These organic solvents are used either singularly or in combinations of two or more thereof.

An aqueous developing solution preferably has an organic solvent concentration of 2 to 90% by mass. The temperature of the aqueous developing solution can be adjusted in accordance with developability. In addition, the pH value of the aqueous developing solution is preferably made as small as possible to the extent of being able to sufficiently develop a resist. Thus, the pH value is preferably pH 8 to 12, and more preferably pH 9 to 10. Small amounts of surface-activating agent, antifoam agent and the like may be added into the aqueous developing solution.

Examples of the organic solvent-based developing solution include 1,1,1-trichloroethane, N-methylpyrrolidone, N,N- dimethylformamide, cyclohexanone, methyl isobutyl ketone, and γ-butyrolactone. Water is preferably added to these organic solvents within the range of 1 to 20% by mass for the prevention of ignition.

Two or more of the abovementioned developing solutions may be concomitantly used as necessary.

Examples of development methods include a dip method, a paddle method, a spray method, a brushing method, and a slapping method. Among these methods, the high-pressure spray method is preferably used from the viewpoint of resolution improvements.

In the conductive pattern formation method of the present embodiment, heating at approximately 60 to 250° C. or exposure at approximately 0.2 to 10 J/cm$^2$ may be performed as necessary, after development, to further cure the conductive pattern.

As described above, according to the conductive pattern formation method in accordance with the present embodiment, a transparent conductive pattern can be easily formed on a substrate, such as a glass substrate, a plastic substrate or the like, without having to forming etching resist as in the case of such an inorganic film as an ITO.

According to the conductive pattern formation method of the present embodiment, the step difference Ha of an obtained conductive pattern can be made smaller. This step difference Ha is preferably 1 μm or smaller. By setting the step difference Ha to within the abovementioned range, the conductive pattern 2a is made difficult to recognize visually. In addition, air bubbles are prevented from getting caught up when the conductive pattern 2a is bonded to a new photosensitive conductive film 10. Thus, it is possible to fabricate a conductive pattern-bearing substrate superior in aesthetics. From the same point of view, the step difference Ha is preferably 0.7 μm or smaller, and more preferably 0.5 μm or smaller. The step difference Ha of the conductive pattern 2a can be adjusted by controlling exposure intensity in the second exposure step.

The step difference Ha of the conductive pattern 2a can be measured by observation using a scanning electron microscope photograph. The entrapment of air bubbles resulting from the step difference Ha can be measured by observation with an optical microscope.

A conductive pattern-bearing substrate according to the present invention can be obtained by the above-described conductive pattern formation method according to the present embodiment. From the viewpoint of being able to effectively use a conductive pattern as a transparent electrode, the surface resistance of the conductive pattern is preferably 2000Ω/□ or lower, more preferably 1000Ω/□ or lower, and particularly preferably 500Ω/□ or lower. The surface resistance can be adjusted by, for example, the type of conductive material, or the concentration or the amount of coated conductor-dispersed solution or conductor solution.

The minimum optical transmittance of the conductive pattern-bearing substrate in a wavelength band of 450 to 650 nm is preferably 80% or higher, and more preferably 85% or higher. If the conductive pattern-bearing substrate satisfies such conditions, it is easy to make brightness high in display panels and the like.

Next, a touch panel sensor according to the present invention will be described.

Figure 5:
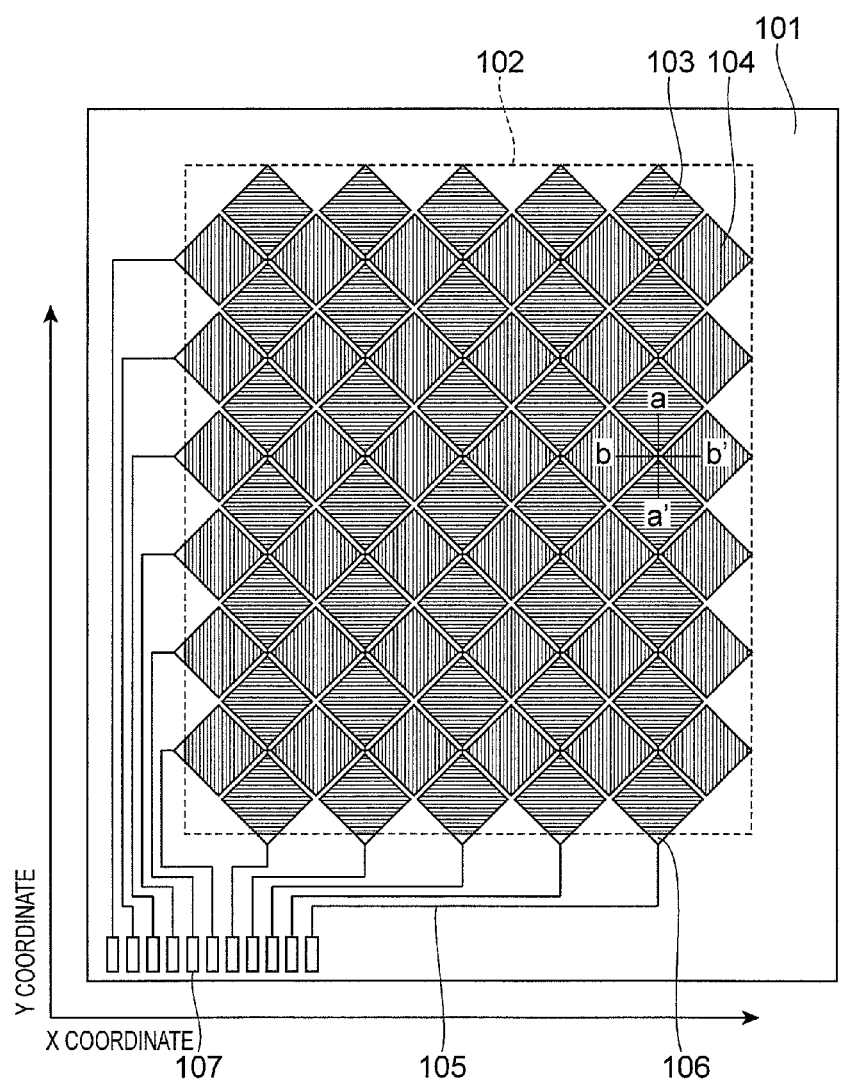
FIG. 5 is a schematic top view illustrating one example of an electrostatic capacitance-type touch panel sensor.

FIG. 5 is a schematic top view illustrating one example of an electrostatic capacitance-type touch panel sensor. The touch panel sensor illustrated in FIG. 5 includes a touch position-detecting touch screen 102 on one side of a transparent substrate 101. In this region, the touch panel sensor is provided with a transparent electrode 103 to determine an X position coordinate, and a transparent electrode 104 to determine a Y position coordinate, by detecting electrostatic capacitance changes. In these transparent electrodes 103 and 104 for determining X and Y position coordinates, there are disposed lead-out wires 105 for connecting the transparent electrodes 103 and 104 to a driver device circuit for controlling electrical signals required of the touch panel, and connecting electrodes 106 for connecting between the lead-out wires 105 and the transparent electrodes 103 and 104. In addition, connecting terminals 107 to be connected to the driver device circuit are disposed at the ends of the lead-out wires 105 on the opposite side of the connecting electrodes 106.

Figure 6:
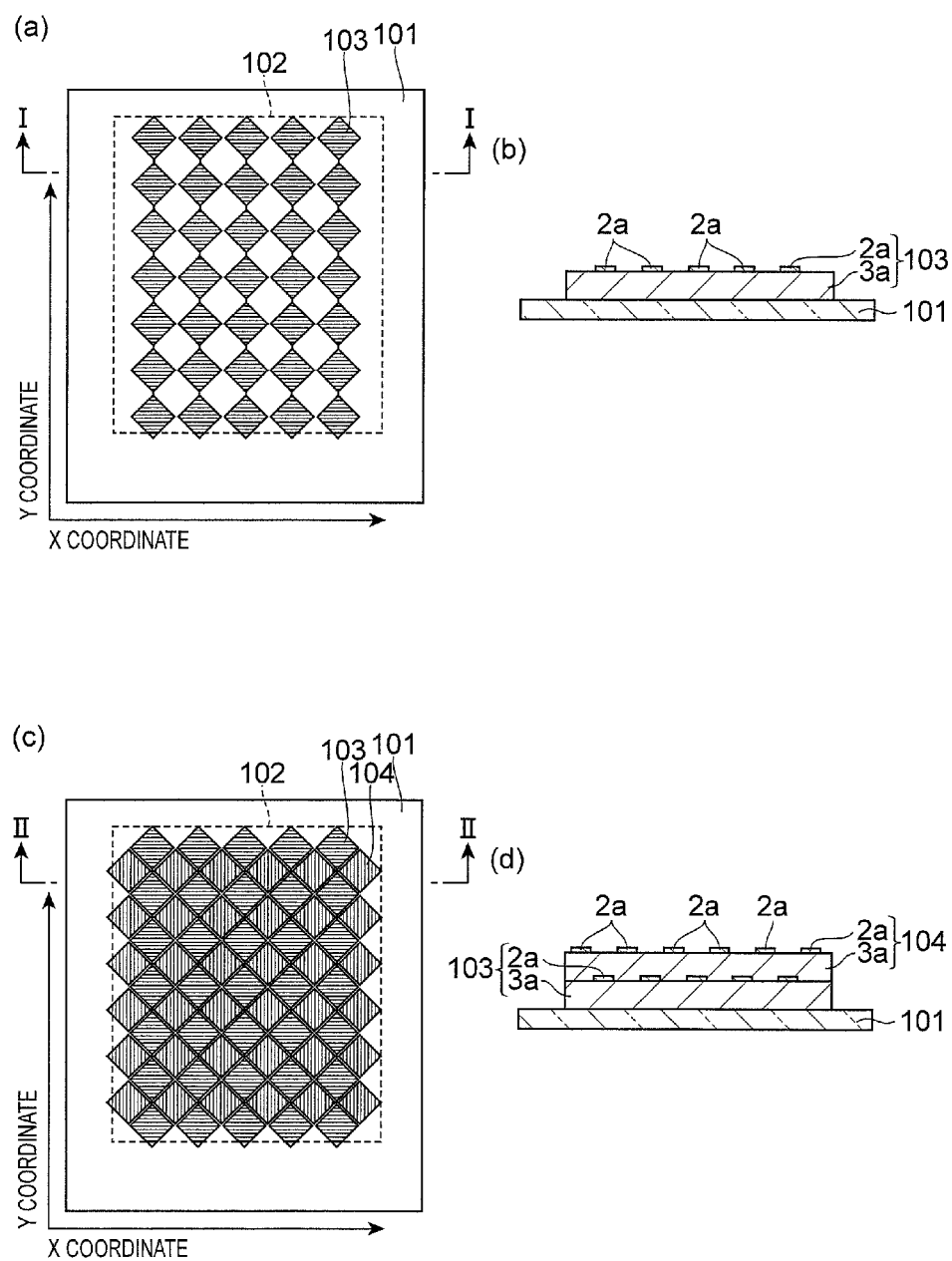
FIG. 6 is a schematic view used to describe one example of a method for manufacturing the touch panel sensor illustrated in FIG. 5.

FIG. 6 is a schematic view used to describe one example of a method for manufacturing the touch panel sensor illustrated in FIG. 5. In the present embodiment, the transparent electrodes 103 and 104 are formed by a conductive pattern formation method according to the present invention.

First, as illustrated in FIG. 6(a), the transparent electrode (X position coordinate) 103 is formed on the transparent substrate 101. Specifically, the photosensitive conductive film 10 is laminated so that the photosensitive resin layer 3 thereof abuts the transparent substrate 101. Active light is radiated in a patterned manner to the transferred photosensitive layer 4 (the conductive film 2 and the photosensitive resin layer 3) through a lightproof mask having a desired shape (first exposure step). Then, after the lightproof mask is removed and the support film is delaminated, active light is radiated to the photosensitive layer 4 (second exposure step). Development is performed after the exposure steps to remove the conductive film 2 along with insufficiently-cured portions of the photosensitive resin layer 3, thereby forming the conductive pattern 2a. This conductive pattern 2a forms the transparent electrode 103 for detecting X position coordinates (FIG. 6(b)). FIG. 6(b) is a schematic cross-sectional view illustrating the I-I cross section of FIG. 6(a). By forming the transparent electrode 103 using the conductive pattern formation method according to the present invention, it is possible to provide the transparent electrode 103 small in step difference.

Subsequently, the transparent electrode (Y position coordinate) 104 is formed as illustrated in FIG. 6(c). A new photosensitive conductive film 10 is additionally laminated on the substrate 101 provided with the transparent electrodes 103 formed by the above-described steps. The transparent electrodes 104 for detecting Y position coordinates are formed by the same operation as described above (FIG. 6(d)). FIG. 6(d) is a schematic cross-sectional view illustrating the II-II cross section of FIG. 6(c). By forming the transparent electrodes 104 using the conductive pattern formation method according to the present invention, it is possible to fabricate a highly smooth touch panel sensor the aesthetic degradation of which due to step differences or the entrapment of air bubbles is fully suppressed, even if the transparent electrodes 104 are formed on the transparent electrodes 103.

Next, the lead-out wires 105 for connection with an external circuit and the connecting electrodes 106 for connection between these lead-out wires and the transparent electrodes 103 and 104 are formed on a surface of the transparent substrate 101. FIG. 6 illustrates that the lead-out wires 105 and the connecting electrodes 106 are formed after the formation of the transparent electrodes 103 and 104. Alternatively, however, the lead-out wires 105 and the connecting electrodes 106 may be formed simultaneously with forming the respective transparent electrodes. The lead-out wires 105 can be formed simultaneously with forming the connecting electrodes 106 by a screen printing method using, for example, an electroconductive paste material containing flaky silver.

Figure 7:
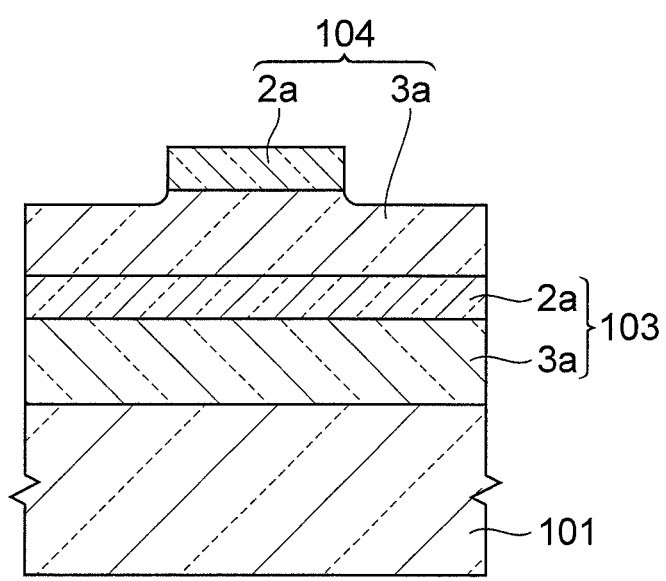
FIG. 7 is a partial cross-sectional view taken along line a-a' shown in FIG. 5.
Figure 8:
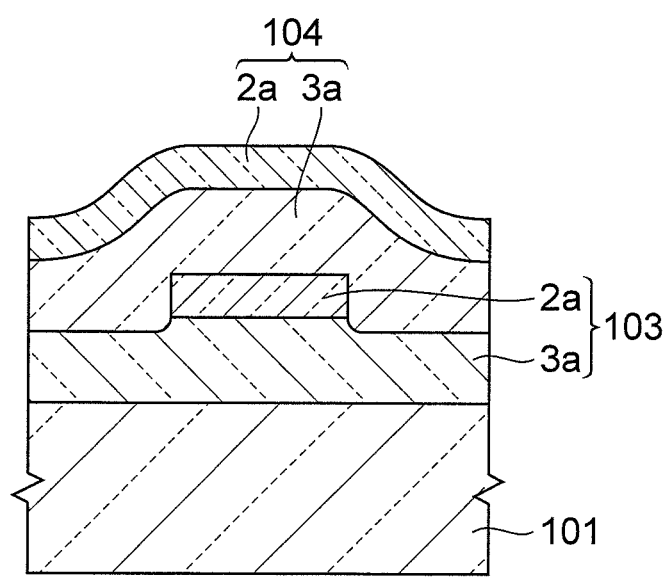
FIG. 8 is a partial cross-sectional view taken along line b-b' shown in FIG. 5.

FIGS. 7 and 8 are partial cross-sectional views taken along lines a-a' and b-b', respectively, shown in FIG. 5. These figures show a crossover site formed by the transparent electrodes of X and Y position coordinates. As illustrated in FIGS. 7 and 8, a touch panel sensor small in step difference and high in smoothness can be obtained as the result of the transparent electrodes being formed by the conductive pattern formation method according to the present invention.

EXAMPLES

Hereinafter, the present invention will be described specifically according to examples, though the invention is not limited to these examples.

<Preparation of Conductor-Dispersed Solution>

(Carbon Nanotube (CNT)-Dispersed Solution)

A high-purity product of the Hipco monolayer carbon nanotube from Unidym, Inc. and dodecyl-pentaethylene glycol used as a surface-activating agent were dispersed in pure water, so that the concentrations thereof were 0.4% and 0.1% by mass, respectively, thereby obtaining a carbon nanotube-dispersed solution.

(Silver Fiber Dispersion Liquid)

[Preparation of Silver Fiber by Polyol Method]

500 mL of ethylene glycol was put in a 2000 mL three-neck flask and heated to 160° C. in a nitrogen atmosphere using an oil bath, while agitating the ethylene glycol with a magnetic stirrer. A separately prepared solution in which 2 mg of $PtCl_2$ was dissolved in 50 mL of ethylene glycol was dripped in the flask. Then, 4 to 5 minutes later, a solution in which 5 g of $AgNO_3$ was dissolved in 300 mL of ethylene glycol and a solution in which 5 g of polyvinyl pyrrolidone having a weight-average molecular weight of 40,000 (made by Wako Pure Chemical Industries, Ltd.) was dissolved in 150 mL of ethylene glycol were dripped from their respective dripping funnels in one minute. Thereafter, the solution thus prepared was agitated at 160° C. for 60 minutes.

The above-described reaction solution was allowed to stand until the solution cooled down below 30° C., and was then diluted tenfold with acetone. The reaction solution was centrifugalized at 2000 revolutions for 20 minutes using a centrifugal separator, and a supernatant solution was decanted. Acetone was added to a sediment and, after agitation, the solution thus prepared was centrifugalized under the same conditions as described above to decant the acetone. Thereafter, the solution was likewise centrifugalized twice using distilled water to obtain silver fiber. Observation of the obtained silver fiber by using a scanning electron microscope photograph showed that the fiber diameter (diameter) of the silver fiber was approximately 5 nm and the fiber length thereof was approximately 5 μm.

[Preparation of Silver Fiber-Dispersed Solution]

The silver fiber obtained as described above and dodecyl-pentaethylene glycol were dispersed in pure water, so that the concentrations thereof were 0.2% and 0.1% by mass, respectively, thereby obtaining a silver fiber-dispersed solution.

(Organic Conductor Solution)

"SEPLEGYDA OC-U1" (trade name of a product made by Shin-Etsu Polymer Co., Ltd.) which is an alcohol solution of polyethylene dioxythiophene was diluted tenfold with methanol to use the resulting solution as an organic conductor solution.

<Binder Polymer Synthesis>

(Acrylic Resin Synthesis)

400 g of a mixed solution of methyl cellosolve and toluene (methyl cellosolve/toluene=3/2 (mass ratio); hereinafter referred to as "solution s") was added into a flask provided with a stirring machine, a reflux condenser, a thermometer, a dripping funnel and a nitrogen gas-introducing pipe. The solution s was agitated, while blowing a nitrogen gas into the solution, and heated to 80° C. On the other hand, there was prepared a solution (hereinafter referred to as "solution a") in which 100 g of methacrylic acid, 250 g of methyl methacrylate, 100 g of ethyl methacrylate and 50 g of styrene were mixed as monomers with 0.8 g of azobisisobutyronitrile. Next, the solution a was dripped over four hours into the solution s heated to 80° C., and the resulting solution was kept warm for two hours while being agitated at 80° C. In addition, a solution in which 1.2 g of azobisisobutyronitrile was dissolved in 100 g of the solution s was dripped into the flask over 10 minutes. Then, the solution after dripping was kept warm at 80° C. for three hours while being agitated, and was heated to 90° C. over 30 minutes. After being kept warm at 90° C. for two hours, the solution was cooled to obtain a binder polymer solution. Acetone was added to this binder polymer solution to adjust the solution, so that the nonvolatile constituents (solid content) thereof were 50% by mass, thereby obtaining a binder polymer solution as constituent (a). The binder polymer thus obtained was 80,000 in weight-average molecular weight, 20% by mass in carboxyl group ratio, and 130 mg KOH/g in acid number. This binder polymer was specified as an acrylic polymer (a1). Likewise, methacrylic acid, methyl methacrylate, and ethyl acrylate were blended at ingredient amounts (unit: parts by mass) shown in Table 1, thereby obtaining a binder polymer solution as the solution a. The binder polymer thus obtained was 65,000 in weight-average molecular weight, 12% by mass in carboxyl group ratio, and 78 mg KOH/g in acid number. This binder polymer was specified as an acrylic polymer (a2). Table 1 shows these results.

Note that the weight-average molecular weight (Mw) was derived by measuring the weight by a gel permeation chromatography (GPC) method, and converting the weight using the analytical curve of standard polystyrene. GPC conditions are shown below.

GPC Conditions

Pump: Hitachi L-6000 Type (trade name of a product made by Hitachi, Ltd.)

Column: Gelpack GL-R420, Gelpack GL-R430, and Gelpack GL-R440 (trade names of products made by Hitachi Chemical Company, Ltd.)

Eluant: Tetrahydrofuran

Measurement temperature: 40° C.

Flow rate: 2.05 mL/min

Detector: Hitachi L-3300 Type RI (trade name of a product made by Hitachi, Ltd.)

<Preparation of Photosensitive Resin Composition Solutions>

Materials shown in Table 2 were blended at ingredient amounts (unit: parts by mass) shown in the table to prepare photosensitive resin composition solutions 1 to 3.

TABLE 1

|  | Constituent (a) | |
| --- | --- | --- |
|  | (a1) | (a2) |
| Methacrylic acid | 20 | 12 |
| Methyl methacrylate | 50 | 58 |
| Ethyl acrylate | 20 | 30 |

TABLE 1-continued

| | Constituent (a) | |
|---|---|---|
| | (a1) | (a2) |
| Styrene | 10 | — |
| Weight-average molecular weight | 80,000 | 65,000 |
| Ratio of carboxyl groups (% by mass) | 20 | 12 |
| Acid number (mgKOH/g) | 130 | 78 |

TABLE 2

| | | Solution 1 | Solution 2 | Solution 3 |
|---|---|---|---|---|
| Constituent (a) | (a1) | 60 | — | — |
| | (a2) | — | 60 | 60 |
| Constituent (b) | DPHA | — | 40 | — |
| | TMPTA | — | — | 40 |
| | PET-30 | 40 | — | — |
| Constituent (c) | Irgacure OXE 01 | 5 | 5 | — |
| | Lucirin TPO | — | — | 5 |
| Other | Methyl ethyl ketone | 120 | 120 | 120 |

The symbols of constituents (b) and (c) in Table 2 have the following meanings:
Constituent (b)
PET-30: Pentaerythritol triacrylate (made by Nippon Kayaku Co., Ltd.)
DPHA: Dipentaerythritol hexaacrylate (made by Nippon Kayaku Co., Ltd.)
TMPTA: Trimethylolpropane triacrylate (made by Nippon Kayaku Co., Ltd.)
Constituent (c)
IRGACURE OXE 01: 1,2-octanedione, 1-[(4-phenylthio)-, 2-(o-benzoyl oxime)] (made by BASF Japan Ltd.)
Lucirin TPO: 2,4,6-trimethyl benzoyl-diphenyl-phosphine oxide (made by BASF Japan Ltd.)

Fabrication of Photosensitive Conductive Film

Manufacturing Example 1

The carbon nanotube-dispersed solution obtained as described above was uniformly coated on a 50 μm-thick polyethylene terephthalate film (PET film "G2-50", 1.2% in haze value, which is a trade name of a product made by Teijin Limited) which was a support film at a density of 25 g/m². Then, the liquid was dried for three minutes with a 100° C. hot-air convection drying machine, and pressurized at room temperature under a line pressure of 10 kg/cm, thereby forming a conductive film on the support film. Note that measurement using a scanning electron microscope photograph showed that the thickness of the conductive film after drying was approximately 0.02 μm.

Next, the abovementioned photosensitive resin composition solution 1 was uniformly coated on the conductive film formed on the polyethylene terephthalate film, and dried for 10 minutes with a 100° C. hot-air convection drying machine, thereby forming a photosensitive resin layer. Note that measurement using a scanning electron microscope photograph showed that the film thickness of the photosensitive resin layer after drying was 5 μm. The minimum optical transmittance of the photosensitive conductive film including the conductive film and the photosensitive resin layer in a wavelength band of 450 to 650 nm was 85%.

Next, the photosensitive resin layer was covered with a polyethylene protective film ("NF-13", 28 μm in thickness, which is a trade name of a product made by TAMAPOLY Co., Ltd.) to obtain a photosensitive conductive film E1.

Manufacturing Example 2

The silver fiber-dispersed solution obtained as described above was uniformly coated on a 50 μm-thick polyethylene terephthalate film (PET film "G2-50", 1.2% in haze value, which is a trade name of a product made by Teijin Limited) which was a support film at a density of 25 g/m². Then, the solution was dried for 10 minutes with a 100° C. hot-air convection drying machine, and pressurized at room temperature under a line pressure of 10 kg/cm, thereby forming a conductive film on the support film. Note that measurement using a scanning electron microscope photograph showed that the thickness of the conductive film after drying was approximately 0.01 μm.

Next, a photosensitive resin layer and a protective film were provided in the same way as in Manufacturing Example 1 to obtain a conductive film E2. Note that measurement using a scanning electron microscope photograph showed that the film thickness of the photosensitive resin layer after drying was 5 μm. In addition, the minimum optical transmittance of the photosensitive conductive film including the conductive film and the photosensitive resin layer in a wavelength band of 450 to 650 nm was 90%.

Manufacturing Example 3

The organic conductor solution obtained as described above was uniformly coated on a 50 μm-thick polyethylene terephthalate film (PET film "G2-50", 1.2% in haze value, which is a trade name of a product made by Teijin Limited) which was a support film at a density of 25 g/m². Then, the solution was dried for three minutes with a 100° C. hot-air convection drying machine, thereby forming a conductive film on the support film. Note that measurement using a scanning electron microscope photograph showed that the thickness of the conductive film after drying was approximately 0.1 μm.

Next, a photosensitive resin layer and a protective film were provided in the same way as in Manufacturing Example 1 to obtain a conductive film E2. Note that measurement using a scanning electron microscope photograph showed that the film thickness of the photosensitive resin layer after drying was 5 μm. In addition, the minimum optical transmittance of the photosensitive conductive film including the conductive film and the photosensitive resin layer in a wavelength band of 450 to 650 nm was 87%.

Manufacturing Examples 4 to 12

Using combinations of photosensitive resin composition solutions and conductive materials shown in Table 3 or 4, photosensitive conductive films E4 to E12 were obtained in the same way as in Manufacturing Example 1. The film thickness of the photosensitive resin layer of every photosensitive conductive film after drying was 5 μm.

[Optical Transmittance Measurement]

The abovementioned minimum optical transmittance in a wavelength band of 450 to 650 nm was measured using a spectral photometer (trade-named "U-3310" and made by Hitachi High-Technologies Corporation).

Conductive Pattern Formation

Example 1

A 0.7 mm-thick soda glass plate was heated to 80° C. Then, the photosensitive conductive film E1 was laminated on a surface of the substrate, under the condition of 120° C., 0.4 MPa, while delaminating a protective film with a photosensitive resin layer facing the substrate. After the lamination, the substrate was cooled and, at a point of time when the temperature of the substrate reached 23° C., an artwork having a wiring pattern, 100/100 μm in line width/space width ratio and 100 mm in length, was closely attached to a surface of a PET film which was a support film. Then, using an exposure machine (trade-named "HMW-201B" and made by OAK Co., Ltd.) including a high-pressure mercury lamp, light radiation was performed on the conductive film and the photosensitive resin layer in the atmosphere at an exposure intensity of 50 mJ/cm² (first exposure step). Thereafter, the artwork was removed, and the PET conductive film which was a support film was delaminated so as to expose the conductive film. At this point in time, the substrate was in a state of including the photosensitive resin layer and the conductive film in this order on the 0.7 mm-thick soda glass plate. Thereafter, using the same exposure equipment, light radiation was performed on the conductive film and the photosensitive resin layer in the atmosphere at an exposure intensity of 50 mJ/cm² (second exposure step).

Figure 9:
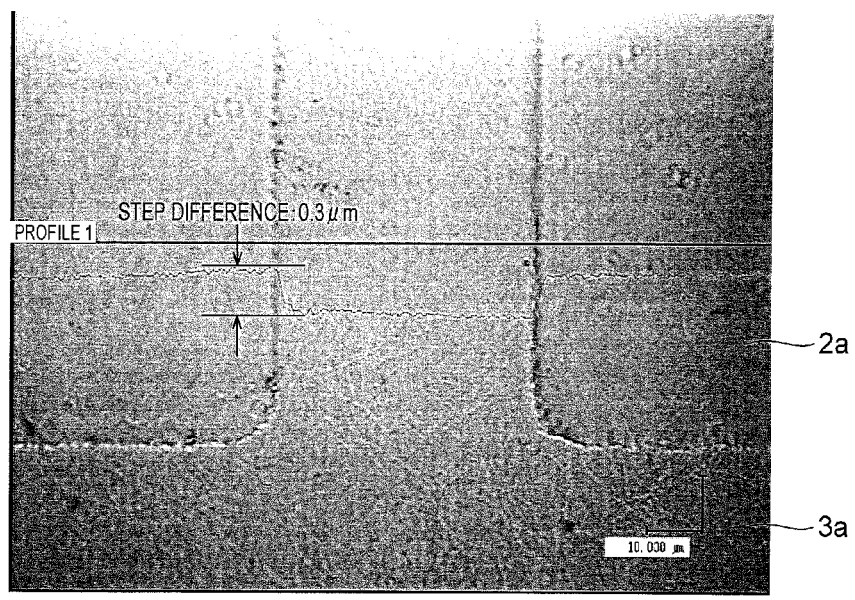
FIG. 9 is a drawing illustrating an SEM photograph and a step difference profile of a conductive pattern formed in Embodiment 1.
Figure 10:
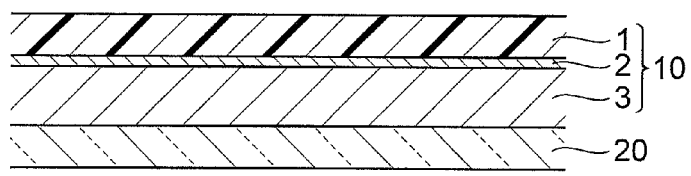
FIG. 10 is a schematic cross-sectional view used to describe one embodiment of a conventional conductive pattern formation method.
Figure 10:
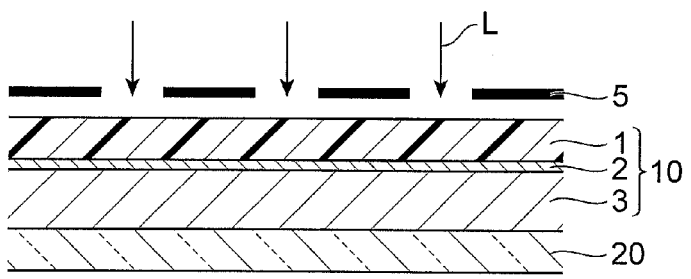
Figure 10:
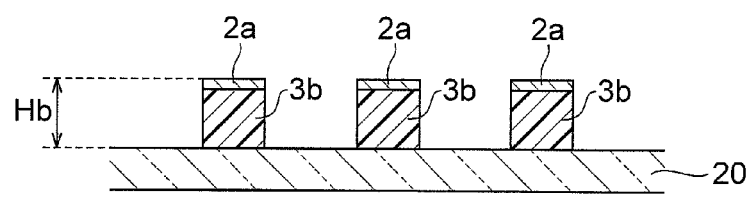

After exposure, the substrate was allowed to stand at room temperature (25° C.) for 15 minutes. Then, a 1% by mass sodium carbonate aqueous solution was sprayed at the substrate for 30 seconds at 30° C. to develop the substrate. By the development, a conductive pattern having a line width/space width ratio of approximately 100/100 μm was formed on the resin cured layer on the soda glass plate. It was confirmed that the formed conductive pattern was difficult to recognize visually, and that the step difference of the conductive pattern from the resin cured layer was 0.3 μm (see FIG. 9). It was also confirmed that whereas a resistance value measured across a 100 mm-long conductive pattern with a tester was 180 kΩ, the resin cured layer other than the portions thereof included in the conductive pattern did not conduct electricity.

Examples 2 to 12

Conductive patterns were formed in Examples 2 to 12, respectively, in the same way as in Example 1, except that the films E2 to E12 were used as the photosensitive conductive films. Every conductive pattern of Examples 2 to 12 was difficult to recognize visually, and the conductive patterns had step differences shown in Table 3. Table 3 also shows the resistance values of the conductive patterns.

Comparative Example 1

A 0.7 mm-thick soda glass plate was heated to 80° C. Then, the photosensitive conductive film E1 was laminated on a surface of the substrate, under the condition of 120° C., 0.4 MPa, while delaminating a protective film with a photosensitive resin layer facing the substrate. After the lamination, the substrate was cooled and, at a point of time when the temperature of the substrate reached 23° C., an artwork having a wiring pattern, 100/100 μm in line width/space width ratio and 100 mm in length, was closely attached to a surface of a PET film which was a support film. Then, using an exposure machine (trade-named "HMW-201B" and made by OAK Co., Ltd.) including a high-pressure mercury lamp, light radiation was performed on the conductive film and the photosensitive resin layer in the atmosphere at an exposure intensity of 50 mJ/cm².

After exposure, the substrate was allowed to stand at room temperature (25° C.) for 15 minutes. Then, a PET film which was a support medium was delaminated and a 1% by mass sodium carbonate aqueous solution was sprayed at the substrate for 30 seconds at 30° C. to develop the substrate. After development, a conductive pattern having a line width/space width ratio of approximately 100/100 μm was formed on the soda glass plate.

Comparative Examples 2 and 3

Conductive patterns were formed in Comparative Examples 2 and 3, respectively, in the same way as in Comparative Example 1, except that the photosensitive conductive films E2 and E3 were used.

Measurement of step differences between the conductive patterns and glass substrates in Comparative Examples 1 to 3 by using a scanning electron microscope photographs confirmed that the step differences were 5.0 μm, 4.9 μm and 5.0 μm, respectively. In addition, resistance values measured across 100 mm-long conductive patterns with a tester were 180 kΩ, 17 kΩ and 130 kΩ, respectively.

[Evaluation of Laminability on Step Differences]

The soda glass plates on which the conductive patterns obtained in the practical and comparative examples were formed were heated to 80° C. Then, the photosensitive conductive film E2 obtained in Manufacturing Example 2 was laminated on a surface of each soda glass plate, under the condition of 120° C., 0.4 MPa, while delaminating the protective film with the photosensitive resin layer facing the substrate. After the lamination, each conductive pattern was verified for the entrapment of air bubbles due to the lamination with an optical microscope at a 50× magnification. Observation of edges of conductive patterns did not show any air bubbles in the substrates fabricated in the examples and having smaller step differences of the conductive patterns. On the other hand, air bubbles were observed at edges of the conductive patterns in all of the substrates of the comparative examples having step differences. Tables 3 and 4 show the results.

[Surface Resistance of Conductive Films]

The surface resistance of conductive films was measured according to the procedure described below. 0.7 mm-thick soda glass plates were separately heated to 80° C. Then, photosensitive conductive films were laminated on surfaces of the soda glass plates, under the condition of 120° C., 0.4 MPa, while delaminating protective films with photosensitive resin layers facing the substrates. Thereafter, the support films were delaminated and the surface resistance of the conductive films was measured by a four-terminal method. Tables 3 and 4 show the results of measurement.

TABLE 3

|  |  | Examples | | | | | |
|---|---|---|---|---|---|---|---|
|  |  | 1 | 2 | 3 | 4 | 5 | 6 |
| Photosensitive conductive film | | E1 | E2 | E3 | E4 | E5 | E6 |
| Photosensitive resin layer | Photosensitive resin composition | Solution 1 | Solution 1 | Solution 1 | Solution 2 | Solution 2 | Solution 2 |
|  | Thickness (μm) | 5 | 5 | 5 | 5 | 5 | 5 |

TABLE 3-continued

| | | | | | | | |
|---|---|---|---|---|---|---|---|
| Conductive film | Conductive material | CNT | Ag | PEDOT | CNT | Ag | PEDOT |
| | Thickness (μm) | 0.02 | 0.01 | 0.1 | 0.02 | 0.03 | 0.09 |
| Minimum optical transmittance (%) | | 85 | 90 | 87 | 85 | 89 | 87 |
| Surface resistance of conductive film (Ω/□) | | 1500 | 300 | 800 | 1500 | 200 | 800 |
| Exposure intensity of second exposure step (mJ/cm²) | | 50 | 50 | 50 | 50 | 50 | 50 |
| Step difference between conductive film and resin cured layer (μm) | | 0.3 | 0.2 | 0.2 | 0.4 | 0.4 | 0.4 |
| Resistance of conductive pattern (kΩ) | | 180 | 16 | 125 | 190 | 18 | 140 |
| Laminability on step difference (entrapment of air bubbles) | | Not observed | Not observed | Not observed | Not observed | Not observed | Not observed |

| | | Examples | | | | | |
|---|---|---|---|---|---|---|---|
| | | 7 | 8 | 9 | 10 | 11 | 12 |
| Photosensitive conductive film | | E7 | E8 | E9 | E10 | E11 | E12 |
| Photosensitive resin layer | Photosensitive resin composition | Solution 3 | Solution 3 | Solution 3 | Solution 3 | Solution 3 | Solution 3 |
| | Thickness (μm) | 5 | 5 | 5 | 5 | 5 | 5 |
| Conductive film | Conductive material | CNT | Ag | PEDOT | Ag | Ag | Ag |
| | Thickness (μm) | 0.03 | 0.05 | 0.11 | 0.05 | 0.06 | 0.03 |
| Minimum optical transmittance (%) | | 85 | 89 | 86 | 89 | 88 | 89 |
| Surface resistance of conductive film (Ω/□) | | 1000 | 150 | 600 | 150 | 130 | 200 |
| Exposure intensity of second exposure step (mJ/cm²) | | 100 | 100 | 100 | 50 | 150 | 200 |
| Step difference between conductive film and resin cured layer (μm) | | 0.8 | 0.7 | 0.8 | 0.8 | 0.6 | 0.4 |
| Resistance of conductive pattern (kΩ) | | 180 | 16 | 130 | 17 | 15 | 15 |
| Laminability on step difference (entrapment of air bubbles) | | Not observed | Not observed | Not observed | Not observed | Not observed | Not observed |

TABLE 4

| | | Comparative examples | | |
|---|---|---|---|---|
| | | 1 | 2 | 3 |
| Photosensitive conductive film | | E1 | E2 | E3 |
| Photosensitive resin layer | Photosensitive resin composition | Solution 1 | Solution 1 | Solution 1 |
| | Thickness (μm) | 5 | 5 | 5 |
| Conductive film | Conductive material | CNT | Ag | PEDOT |
| | Thickness (μm) | 0.02 | 0.01 | 0.1 |
| Optical transmittance (%) | | 85 | 90 | 87 |
| Surface resistance of conductive film (Ω/□) | | 1500 | 300 | 800 |
| Exposure intensity of exposure step (mJ/cm²) | | 50 | 50 | 50 |
| Step difference between conductive film and substrate (μm) | | 5.0 | 4.9 | 5.0 |
| Resistance of conductive pattern (kΩ) | | 180 | 17 | 130 |
| Laminability on step difference (entrapment of air bubbles) | | Observed | Observed | Observed |

The symbols of conductive materials in Tables 3 and 4 have the following meanings:
CNT: Monolayer carbon nanotube (Hipco made by Unidym, Inc.)
PEDOT: Polyethylenedioxythiophene (SEPLEGYDA OC-U1 made by Shin-Etsu Polymer Co., Ltd.)

INDUSTRIAL APPLICABILITY

According to the present invention, it is possible to provide a conductive pattern formation method capable of forming a conductive pattern small in step difference on a substrate, and a conductive pattern-bearing substrate and a touch panel sensor obtained using this method. The conductive pattern-bearing substrate and touch panel sensor according to the present invention can be superior in aesthetics.

REFERENCE SIGNS LIST

1: support film; 2: conductive film; 2a: conductive pattern; 3: photosensitive resin layer; 3a: resin cured layer; 4: photosensitive layer; 5: mask pattern; 10, 12: photosensitive conductive film; 20: substrate; 40, 42: conductive pattern-bearing substrate; 101: transparent substrate; 102: touchscreen; 103: transparent electrode (X position coordinate); 104: transparent electrode (Y position coordinate); 105: lead-out wire; 106: connecting electrode; and 107: connecting terminal.

The invention claimed is:
1. A conductive pattern formation method comprising:
a first exposure step of radiating active light in a patterned manner to a photosensitive layer including a photosensitive resin layer provided on a substrate and a conductive film provided on a surface of the photosensitive resin layer on a side opposite to the substrate;
a second exposure step of radiating active light, in the presence of oxygen, to some or all of the portions of the photosensitive layer not exposed at least in the first exposure step; and
a development step of developing the photosensitive layer to form a conductive pattern following the second exposure step.
2. The conductive pattern formation method according to claim 1, wherein the photosensitive layer is provided by laminating a photosensitive conductive film including a support film, the conductive film provided on the support film, and the photosensitive resin layer provided on the conductive film, so that the photosensitive resin layer abuts the substrate.

3. The conductive pattern formation method according to claim 2, wherein the first exposure step is a step of radiating active light to the photosensitive layer with the support film, and the second exposure step is a step of radiating active light to the photosensitive layer wherefrom the support film is removed.

4. The conductive pattern formation method according to claim 1, wherein the conductive film contains an organic conductive material.

5. The conductive pattern formation method according to claim 1, wherein the conductive film contains conductive fiber.

6. The conductive pattern formation method according to claim 5, wherein the conductive fiber is silver fiber.

7. The conductive pattern formation method according to claim 1, wherein the conductive film contains at least one type of conductive material selected from the group consisting of polythiophene, a polythiophene derivative, polyaniline, and a polyaniline derivative.

8. The conductive pattern formation method according to claim 1, wherein the photosensitive resin layer contains a binder polymer, a photopolymerizable compound including ethylenically unsaturated bonds, and a photopolymerization initiator.

9. The conductive pattern formation method according to claim 1, wherein the photosensitive layer is provided by laminating a photosensitive conductive film including a support film, the conductive film provided on the support film, and the photosensitive resin layer provided on the conductive film, so that the photosensitive resin layer abuts the substrate, and wherein the conductive film contains an organic conductive material.

10. The conductive pattern formation method according to claim 1, wherein the first exposure step is a step of radiating active light to the photosensitive layer with a support film, and the second exposure step is a step of radiating active light to the photosensitive layer wherefrom the support film is removed, and wherein the conductive film contains an organic conductive material.

11. The conductive pattern formation method according to claim 1, wherein the photosensitive layer is provided by laminating a photosensitive conductive film including a support film, the conductive film provided on the support film, and the photosensitive resin layer provided on the conductive film, so that the photosensitive resin layer abuts the substrate, and wherein the conductive film contains conductive fiber.

12. The conductive pattern formation method according to claim 1, wherein the first exposure step is a step of radiating active light to the photosensitive layer with a support film, and the second exposure step is a step of radiating active light to the photosensitive layer wherefrom the support film is removed, and wherein the conductive film contains conductive fiber.

13. The conductive pattern formation method according to claim 1, wherein the conductive film contains at least one type of conductive material selected from the group consisting of inorganic conductive materials and organic conductive materials, and wherein the conductive film contains conductive fiber.

14. The conductive pattern formation method according to claim 1, wherein the photosensitive layer is provided by laminating a photosensitive conductive film including a support film, the conductive film provided on the support film, and the photosensitive resin layer provided on the conductive film, so that the photosensitive resin layer abuts the substrate, wherein the conductive film contains at least one type of conductive material selected from the group consisting of inorganic conductive materials and organic conductive materials, and wherein the conductive film contains conductive fiber.

15. The conductive pattern formation method according to claim 1, wherein the first exposure step is a step of radiating active light to the photosensitive layer with a support film, and the second exposure step is a step of radiating active light to the photosensitive layer wherefrom the support film is removed, wherein the conductive film contains at least one type of conductive material selected from the group consisting of inorganic conductive materials and organic conductive materials, and wherein the conductive film contains conductive fiber.

16. The conductive pattern formation method according to claim 1, wherein the photosensitive layer is provided by laminating a photosensitive conductive film including a support film, the conductive film provided on the support film, and the photosensitive resin layer provided on the conductive film, so that the photosensitive resin layer abuts the substrate, and wherein the conductive film contains conductive fiber, the conductive fiber being silver fiber.

17. The conductive pattern formation method according to claim 1, wherein the first exposure step is a step of radiating active light to the photosensitive layer with a support film, and the second exposure step is a step of radiating active light to the photosensitive layer wherefrom the support film is removed, and wherein the conductive film contains conductive fiber, the conductive fiber being silver fiber.

18. The conductive pattern formation method according to claim 1, wherein the conductive film contains an organic conductive material, and wherein the conductive film contains conductive fiber, the conductive fiber being silver fiber.

19. The conductive pattern formation method according to claim 1, wherein the photosensitive layer is provided by laminating a photosensitive conductive film including a support film, the conductive film provided on the support film, and the photosensitive resin layer provided on the conductive film, so that the photosensitive resin layer abuts the substrate, wherein the conductive film contains at least one type of conductive material selected from the group consisting of inorganic conductive materials and organic conductive materials, and wherein the conductive film contains conductive fiber, the conductive fiber being silver fiber.

20. The conductive pattern formation method according to claim 1, wherein the first exposure step is a step of radiating active light to the photosensitive layer with a support film, and the second exposure step is a step of radiating active light to the photosensitive layer wherefrom the support film is removed, wherein the conductive film contains at least one type of conductive material selected from the group consisting of inorganic conductive materials and organic conductive materials, and wherein the conductive film contains conductive fiber, the conductive fiber being silver fiber.

21. The conductive pattern formation method according to claim 1, wherein the conductive film contains an inorganic conductive material.

22. The conductive pattern formation method according to claim 1, wherein the photosensitive layer is provided by laminating a photosensitive conductive film including a support film, the conductive film provided on the support film, and the photosensitive resin layer provided on the conductive film, so that the photosensitive resin layer abuts the substrate, and wherein the conductive film contains an inorganic conductive material.

23. The conductive pattern formation method according to claim 1, wherein the first exposure step is a step of radiating active light to the photosensitive layer with a support film, and the second exposure step is a step of radiating active light to the photosensitive layer wherefrom the support film is removed, and wherein the conductive film contains an inorganic conductive material.

24. The conductive pattern formation method according to claim 1, wherein the conductive film contains an inorganic conductive material, and wherein the conductive film contains conductive fiber, the conductive fiber being silver fiber.

* * * * *